(12) United States Patent
Kaya et al.

(10) Patent No.: US 11,171,570 B2
(45) Date of Patent: **\*Nov. 9, 2021**

(54) HIGH LOW POWER CONVERTER SWITCHES, LATCH, DIODE ISOLATED INTERMEDIATE GROUND

(71) Applicant: Texas Instruments Incorporated, Dallas, TX (US)

(72) Inventors: Cetin Kaya, Plano, TX (US); Paul Brohlin, Parker, TX (US); Michael Lueders, Freising (DE); Johan Strydom, Saratoga, CA (US)

(73) Assignee: TEXAS INSTRUMENTS INCORPORATED, Dallas, TX (US)

( \* ) Notice: Subject to any disclaimer, the term of this patent is extended or adjusted under 35 U.S.C. 154(b) by 0 days.

This patent is subject to a terminal disclaimer.

(21) Appl. No.: 16/741,856

(22) Filed: Jan. 14, 2020

(65) Prior Publication Data
US 2020/0153343 A1 May 14, 2020

Related U.S. Application Data

(63) Continuation of application No. 16/412,102, filed on May 14, 2019, now Pat. No. 10,581,335, which is a
(Continued)

(51) Int. Cl.
*H02M 3/337* (2006.01)
*H02M 3/335* (2006.01)
(Continued)

(52) U.S. Cl.
CPC ..... *H02M 3/3376* (2013.01); *H02M 3/33569* (2013.01); *H02M 1/0032* (2021.05);
(Continued)

(58) Field of Classification Search
CPC ........... H02M 3/33569; H02M 3/3376; H02M 3/33507; H02M 3/33523; H02M 1/32; H02M 2001/0032
(Continued)

(56) References Cited

U.S. PATENT DOCUMENTS 5,869,935 A \* 2/1999 Sodhi ................. H05B 41/2855
315/127
6,255,900 B1 \* 7/2001 Chang ..................... G05F 3/242
327/540
(Continued)

OTHER PUBLICATIONS

International Rectifer,"HV Floating MOS-Gate Driver ICs," Application Note AN-978, AN-978 RevD, www.irf.com, Mar. 23, 2007, 30 pages.
(Continued)

*Primary Examiner* — Yemane Mehari
(74) *Attorney, Agent, or Firm* — Ray A. King; Charles A. Brill; Frank D. Cimino

(57) ABSTRACT

Methods, systems, and apparatus to facilitate high side control of a switching power converter are disclosed. An example apparatus includes a latch including a first node coupled to a first source of a first switch and an output coupled to a first gate of the first switch; a first diode coupled to the first node and a second node; a second diode coupled to the second node and ground; a second switch coupled to a voltage source and the second node; and a third switch including a third gate coupled to the second switch, a third source coupled to the second node, and a third drain coupled to the latch.

20 Claims, 10 Drawing Sheets

Related U.S. Application Data continuation of application No. 16/122,646, filed on Sep. 5, 2018, now Pat. No. 10,439,503.

(51) Int. Cl.
 *H02M 1/32* (2007.01)
 *H02M 1/00* (2006.01)

(52) U.S. Cl.
 CPC .......... *H02M 1/32* (2013.01); *H02M 3/33507* (2013.01); *H02M 3/33523* (2013.01)

(58) Field of Classification Search
 USPC ...................................... 363/17, 21.01–21.18
 See application file for complete search history.

(56) References Cited

U.S. PATENT DOCUMENTS

| | | | | |
|---|---|---|---|---|
| 7,145,370 | B2* | 12/2006 | Bernard | ........... H03K 3/356113 327/112 |
| 8,598,939 | B2* | 12/2013 | Shimizu | ............. H03K 17/6874 327/436 |
| 8,970,460 | B2* | 3/2015 | Yaguma | ............... G09G 3/3696 345/87 |
| 2006/0250188 | A1* | 11/2006 | Kaya | ....................... H03F 3/217 330/277 |
| 2011/0140774 | A1* | 6/2011 | Kaya | ..................... H03F 3/3022 330/124 R |
| 2013/0257483 | A1* | 10/2013 | Bulzacchelli | .... H03K 3/356139 327/53 |
| 2016/0329809 | A1* | 11/2016 | Granato | ................ H02M 3/158 |
| 2017/0302178 | A1 | 10/2017 | Bandyopadhyay et al. | |

OTHER PUBLICATIONS

Clancy Soehren, "Understanding the Absolute Maximum Ratings of the SW Node," Battery Power Applications, Texas Instruments, Application Report SLVA494A, Dec. 2011, Revised Jan. 2012, 8 pages.

Vicky Wong, Lowest Noise Zero-Drift Amplifier Has 5.6 nV/√Hz Voltage Noise Density, Analog Devices, AN-1114, Application Note, 2014, www.analog.com, 8 pages.

Power Guru, "The Half-Bridge Circuit Revealed," PowerGuru—Power Electronics Information Portal, http://www.powerguru.org/the-half-bridge-circuit-revealed/, posted on Aug. 30, 2012, 6 pages.

Search Report for PCT Application No. PCT/US19/49425, dated Dec. 12, 2019, 1 page.

* cited by examiner

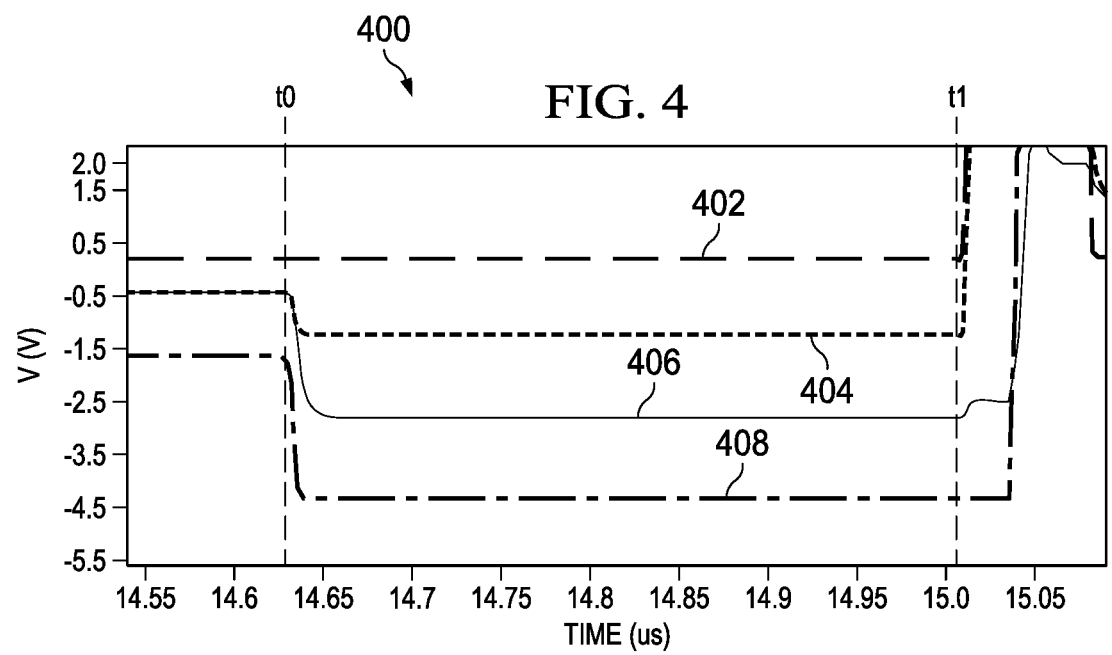
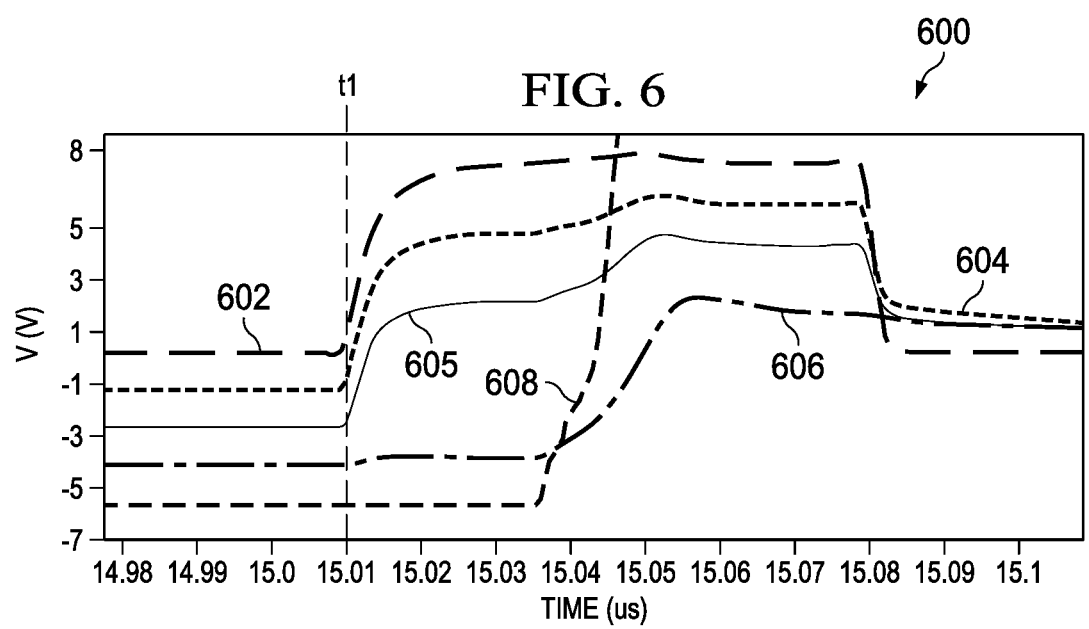

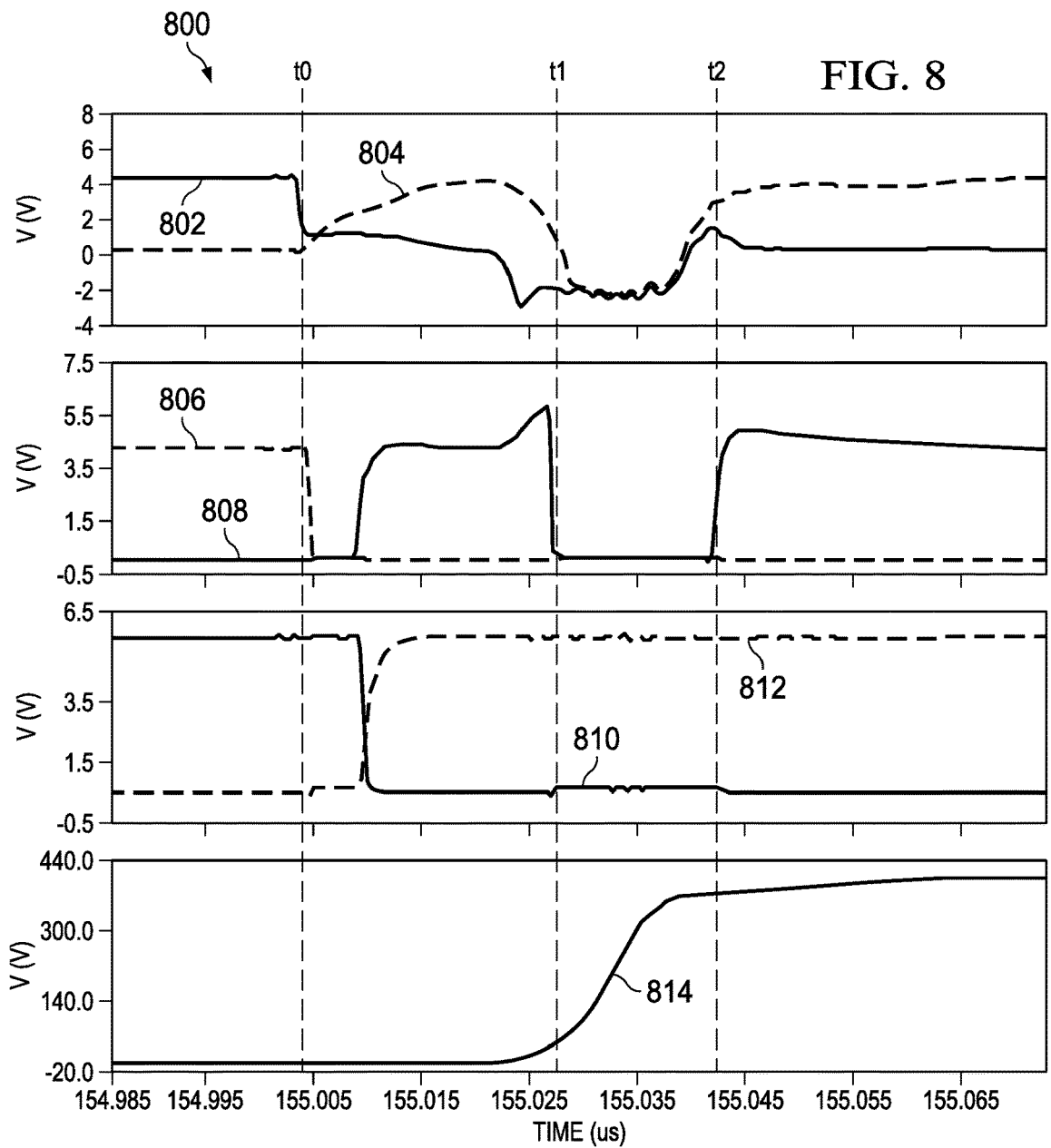
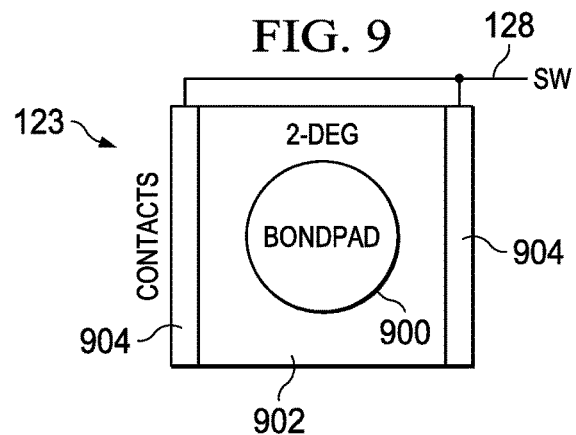

US 11,171,570 B2

HIGH LOW POWER CONVERTER SWITCHES, LATCH, DIODE ISOLATED INTERMEDIATE GROUND

CROSS REFERENCE TO RELATED APPLICATIONS

Under 35 U.S.C. § 120, this continuation application claims benefits of priority to U.S. patent application Ser. No. 16/412,102, filed on May 14, 2019, now U.S. Pat. No. 10,581,335, issued Mar. 3, 2020; which claims benefits of priority to U.S. patent application Ser. No. 16/122,646, filed on Sep. 5, 2018, now U.S. Pat. No. 10,439,503, issued Oct. 8, 2019. The above referenced applications are hereby incorporated herein by reference in their entirety.

FIELD OF THE DISCLOSURE

This disclosure relates generally to power converters and, more particularly, to methods, apparatus, and systems to facilitate high side control of a switching power converter.

BACKGROUND

A power converter is a circuit that is used in various devices to convert an input voltage to a desired output voltage. For example, a buck converter converts an input voltage into a lower output voltage by controlling transistors and/or switches to charge and/or discharge inductors and/or capacitors to maintain the desired output voltage. Some power converters may include one or more power switches that may be switched on and/off in synchronization (e.g., when one switch is on the other is off) to change the path of current in the power converters. In some examples, such as in high voltage power converters, wide band gap devices may be used to implement the power switches for high voltage and/or high temperature power switching applications.

SUMMARY

Certain examples disclosed herein facilitate high side control of a switching power converter. An example apparatus includes a latch including a first node coupled to a first source of a first switch and an output coupled to a first gate of the first switch; a first diode coupled to the first node and a second node; a second diode coupled to the second node and ground; a second switch coupled to a voltage source and a resistor; and a third switch including a third gate coupled to the resistor and the second switch, a third source coupled to the second node, and a third drain coupled to the latch.

BRIEF DESCRIPTION OF THE DRAWINGS

FIG. 4 illustrates a timing diagram corresponding to a low side to high side transition using the high side level shifter of FIGS. 2 and/or 3.
FIG. 6 illustrates a timing diagram corresponding to a low side to high side transition using the alternative high side level shifting trigger of FIG. 5.

FIG. 8 illustrates a timing diagram corresponding to a low side to high side transition using the alternative high side level shifter latch of FIG. 8.
FIG. 9 illustrates an example bond pad of FIG. 1.

The figures are not to scale. Wherever possible, the same reference numbers will be used throughout the drawing(s) and accompanying written description to refer to the same or like parts.

DETAILED DESCRIPTION

Figure 1:
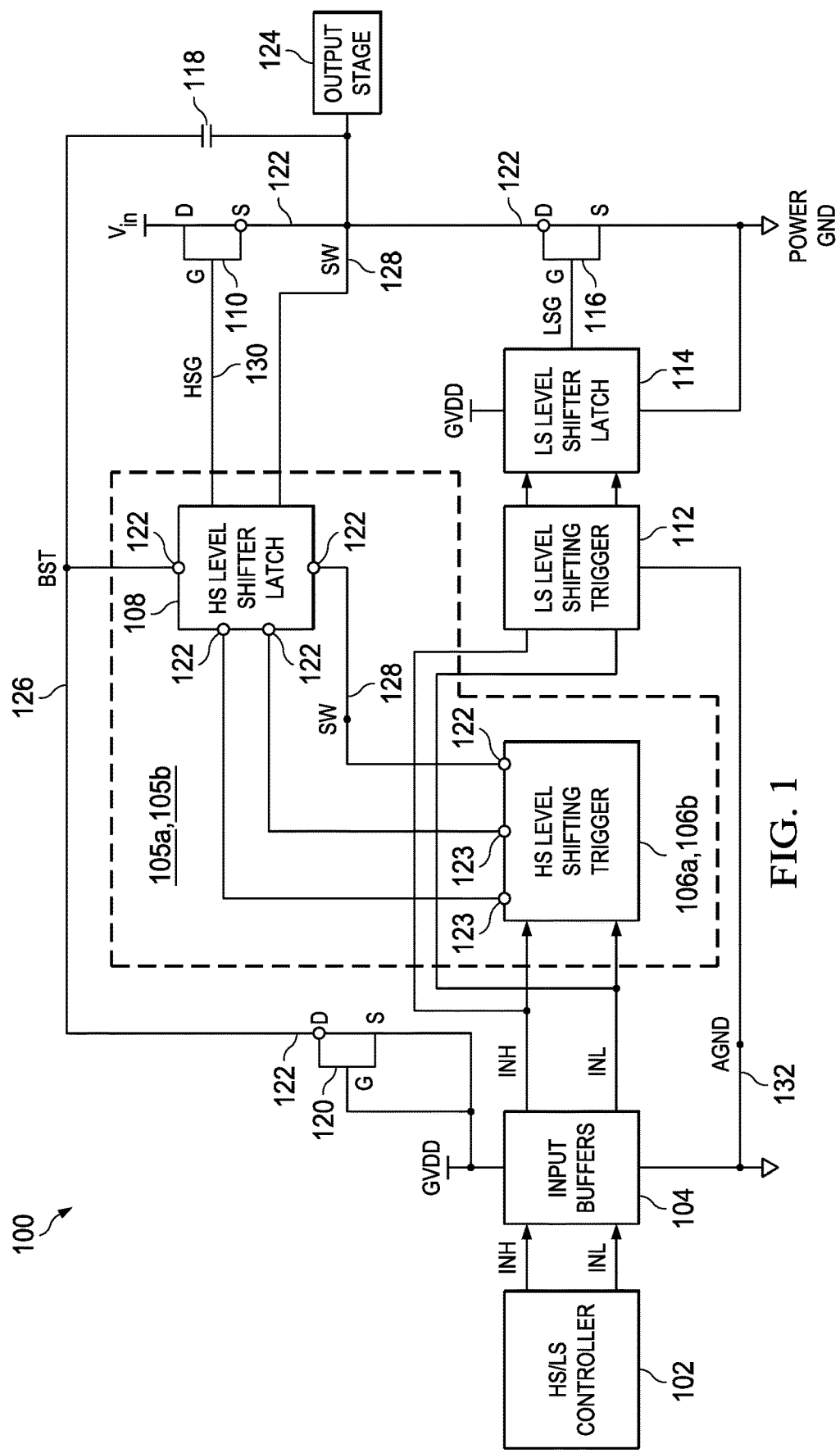
FIG. 1 illustrates an example switching power converter.

Power converters (e.g., buck converters, boost converters, alternating current (AC)-AC converters, direct current (DC)-DC converters, AC-DC converters, etc.) may include power switches (e.g., relays, metal oxide silicon field effect transistors (MOSFETs), etc.) in a half-bridge power stage that switch currents from one path (e.g., from a voltage source (Vdd) to an output) to another (e.g., from the output to ground). In such half bridge switching converters, a microcontroller outputs a control signal to a low side level shifter and/or a high side level shifter. The low side level shifter enables, based on the control signal, a low side switch to decrease the output voltage of the power converter. The high side level shifter enables a high side level shifter to enable the high side switch/transistor to increase the output voltage of the power converter. The microcontroller may output the control signal(s) to the level shifters to toggle between high side control (e.g., by enabling the high side switch and disabling the low side switch) and the low side control (e.g., by disabling the high side switch and enabling the low side switch) at a frequency and/or pulse width modulation to generate a desired output voltage.

The level shifters in a power converter convert a received digital control signal at a logic standard (e.g., the 3.3 Volts (V) or 5 V output of a microcontroller representing a logic value of '1') to a second logic standard (e.g., another voltage, say 400 V representing a logic value of '1') corresponding to a voltage high enough to control a high side switch. In some half-bridge converters, the high side level shifter includes one of more latches to hold state information (e.g., logic '1' or logic '0') to trigger an output voltage high enough to enable a high side switch or an output voltage low enough to disable the high side switch. For example, when the output of the microcontroller corresponds to a logic value of '1' (e.g., 3.3 V or 5 V, etc.), the one or more latches outputs a voltage to the gate of the high side switch, the voltage raising to the bootstrap node potential to enable the high side switch. In such an example, when the output of the microcontroller corresponds to a logic value of '0' (e.g., 0 V or ground), the one or more latches outputs a voltage to the gate of the high side switch, the voltage at the gate of the high side switch being the same as the voltage at the switch node, thereby disabling the low side switch. The bootstrap node corresponds to a bootstrap capacitor coupled to switching node, the voltage across the bootstrap capacitor corresponding to a voltage at the bootstrap node that is higher than the voltage at the switching node. The switching node corresponding to the node coupled to the source of the high side switch, the drain of the low side switch, and the output stage of the power converter.

Gallium Nitride (GaN) switches are wide band gap transistors that may be used to implement the switching devices of a power converter. GaN switches (e.g., transistors) have very high breakdown voltages (e.g., reverse bias breakdown voltages that can be greater than [min breakdown]V), high electron mobility and saturation velocity. Accordingly, GaN switches are used in high-power and/or high-frequency power converters or other high-voltage switching devices. Such systems have parasitic inductance and parasitic capacitance. GaN transistors include a thick layer of highly resistive GaN layer between a silicon layer and the source, gate, and drain of the transistor.

Some wide bandgap devices, such as GaN transistors, lack an inherent body diode. Accordingly, when GaN transistors are implemented in half bridge switching converters, the switching node (e.g., the node that connects the half bridge to an output stage) may become negative. For example, when the amount of current being drawn from ground during low side control and/or during dead time (e.g., a duration of time between low side control and high side control when both the high side and low side transistors are disabled) is high enough (e.g., 4 amperes (A) or more), the voltage at the switching node may become negative as an inductor of the power converter draws negative current through the low side transistor/switch. If the voltage at the switching node becomes too negative (e.g., −4V, −5 V, etc.), the level shifter is unable to trigger one or more latches. Accordingly, the power converter may not be able to trigger high side control. Examples disclosed herein include circuitry to provide a moving level shifting ground that tracks the voltage at the switching node to a preset voltage higher than the switching voltage, when the switching voltage is negative. In this manner, the voltage at the moving level shifting ground will always be low enough to ensure that the latch can be triggered based on a voltage difference corresponding to the moving level shifting ground. When the voltage at the switching node is positive, the voltage at the moving level shifting ground tracks ground to a preset voltage higher than ground, when the switching voltage is positive. In this manner, the level shifters can control a high side switch when the switching voltage is negative.

Additionally, some switching converters include bond wire and/or bond pads to couple together components of a power converter. Bond wire and/or pond pads have inherent parasitic capacitance. Such capacitance may pull down or pull up one or more nodes (e.g., pull up a node of the latch above the bootstrap node and/or pull down a node of the latch below the switching node) in and/or coupled to one or more level shifters of a power converter, thereby causing undesired voltage shifts at nodes in the level shifters. Such undesired voltage shifts may cause the one or more latches in the level shifters to not flip state information when they are supposed to or to flip state information when they are not supposed to. Additionally, some power converters may have device mismatches. Device mismatch corresponds to differences between devices in a circuit that would ideally be the same and have the same operating parameters to accurately function. Mismatches in GaN-based circuits may be higher than silicon-based circuits because of voltage threshold movements under high voltage reverse bias stress. Examples disclosed herein include circuitry to provide two separate hysteresis paths in a latch of a level shifter. The hysteresis paths add resistance to one side of the latch that pulls inner nodes of the latch to a prior state after a high slew rate transition (e.g., when state information in the level shifter is rectified and/or lost). In this manner, undesired voltage shifts caused by parasitic capacitance of bond wires bond pads, and/or devices (e.g., drain-to-source capacitance of transistors) will not cause undesired state information flips in the latch(es).

Some examples disclosed herein apply shielding to bond pads and/or bond wires to lower the parasitic capacitance. For example, shielding can be added where high voltage on a pad would be shielded using two-dimensional electron gas layer (2-DEG) or lower level metal tied to the switching node at the level shifter. Using such examples disclosed herein, the parasitic capacitance is decreased to lower the effect of the parasitic capacitance.

FIG. 1 illustrates an example power converter 100 (e.g., a switching power converter) to converter an input voltage (Vin) to a desired output voltage. The power converter 100 includes an example controller 102, example input buffers 104, an example high side level shifter 105a, 105b including an example high side level shifting trigger 106a, 106b and an example high side level shifter latch 108, an example high side switch 110, an example low side level shifter including an example low side level shifting trigger 112 and an example low side level shifter latch 114, an example low side switch 116, an example diode 120, example inter-die bond pads 122, an example output stage 124, and an example bootstrap node 126, an example switching node 128, an example high side gate node 130, and an example ground node 132. In some examples, the power converter 100 is a gallium nitride (GaN) die to implement the input buffers 104, the high side level shifter 105b, the high side switch 110, the low side level shifting trigger 112, the low side switch 116, and/or the diode 120.

Figure 2:
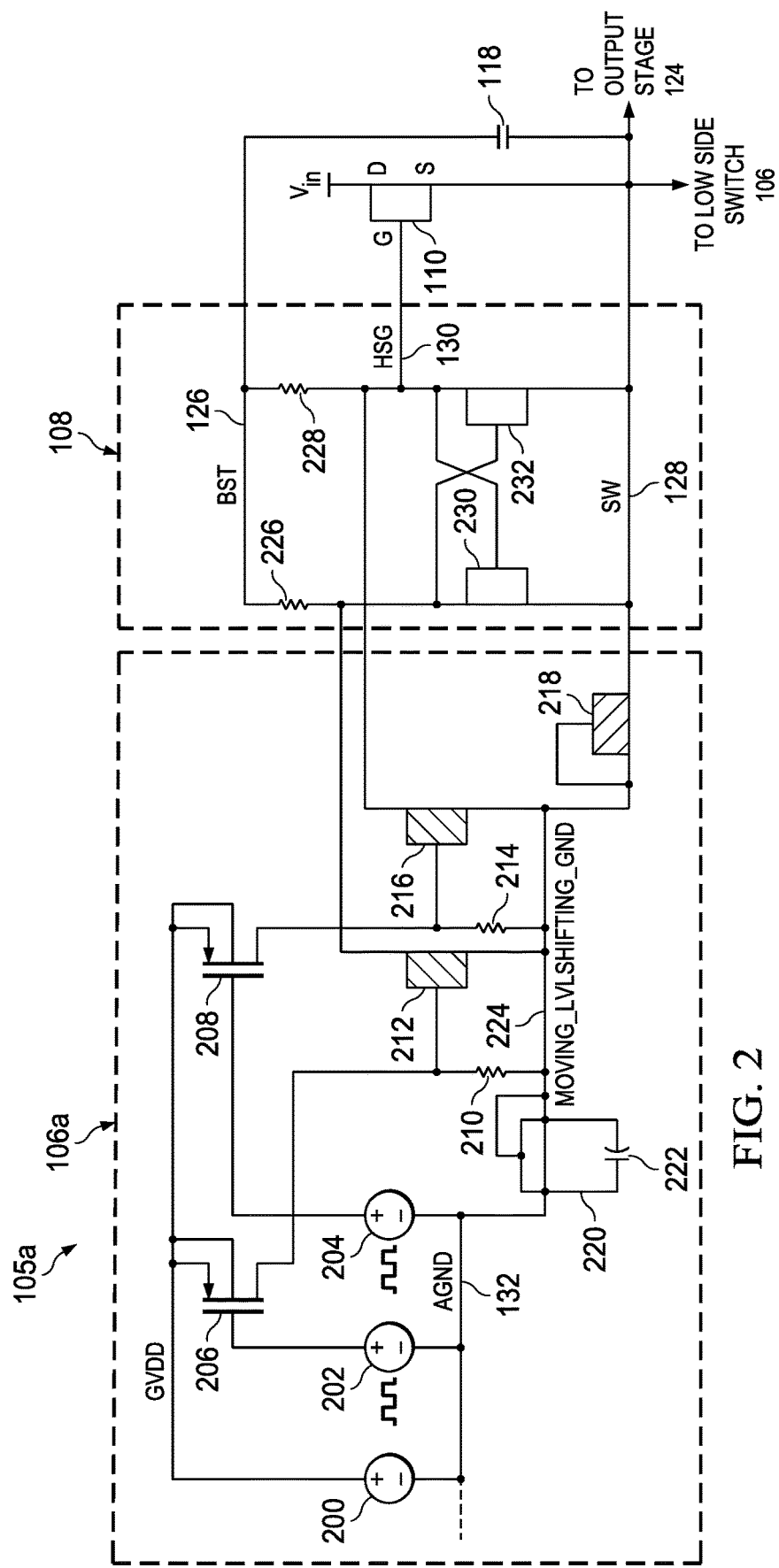
FIG. 2 illustrates an example circuit implementation of a high side level shifter of FIG. 1.

The controller 102 of FIG. 2 is a controller that outputs control signals(s) corresponding to logic value(s) (e.g., '1' or '0'). For example, the controller 102 may output a first logic value, '1,' on an input high side node (INH) and a second logic value, '0,' on an input low side node (INL) to trigger high side control (e.g., by enabling the example switch 110 and disabling the example switch 116 to cause the input voltage to charge the output stage 124). Additionally, the controller 102 may output the second logic value, '0,' on an input high side node (INH) and the first logic value, '1,' on an input low side node (INL) to trigger low side control (e.g., by disabling the example switch 110 and enabling the example switch 116 to cause the output stage 124 to discharge toward ground). In some examples, the controller 102 outputs the second logic value '0' on at both the low side and input high side nodes to trigger dead time (e.g., where both the high side switch 110 and the low side switch 116 are disabled) for a short duration of time between high side and low side control (e.g., or vice versa) to prevent shoot through (e.g., a short from Vin to ground). The controller 102 toggles the logic values output on the input nodes at a frequency or pulse width modulation so that the voltage at the output stage 124 corresponds to a desired output voltage. The controller 102 outputs the logic signals to the input buffers 104 via the input nodes to initiate control of the switches 110, 116. The input buffers 104 store the output of the controller 102 before it is processed by the high side level shifting trigger 106a, 106b and/or the low side level shifting trigger 112.

Once the input buffers 104 of FIG. 1 buffer the control signals from the controller 102, the control signals are transmitted to the (high side) HS level shifting trigger 106a, 106b and the low side level shifting trigger 112 to trigger high side or low side control. For example, if the control signal logic on the input high side node is high (e.g., '1') and the control signal logic on the input low side node is low (e.g. '0'), the high level shifting trigger 106a, 106b triggers the high side level shifter latch 108 to output a high logic value (e.g., a voltage high enough to enable the high side switch 110) at the high side gate node 130 to enable the high side switch 110 and the low side level shifting trigger 112 triggers the low side level shifter latch 114 to output a low logic value (e.g., a voltage low enough to disable the low side switch 116) at the gate of the low side switch 116 to disable the low side switch 116. Additionally, if the control signal logic on the input high side node is low and the control signal logic on the input low side node is high, the high side level shifting trigger 106a, 106b triggers the high side level shifter latch 108 to output a low logic value at the high side gate node 130 to disable the high side switch 110 and the low side level shifting trigger 112 triggers the low side level shifter latch 114 to output a high logic value at the gate of the low side switch 116 to enable the low side switch 116. During deadtime (e.g., when the controller 102 outputs low logic values on both the high side input and the input low side to prevent shoot through), both the high side level shifting trigger 106a, 106b and the low side shifting trigger 112 trigger the respective level shifter latches 108, 114 to output voltages at the gate of the switches 110, 116 to disable the switches 110, 116. In some examples, the level shifter latches 108, 114 may include two latches. An example of a two-latch level shifter implementation is further described below in conjunction with FIG. 7.

The switches 110, 116 of FIG. 1 are transistors (e.g., the high side switch 110 is a high side transistor and the low side switch 116 is a low side transistor). For example, as illustrated in FIG. 1 the switches 110, 116 are gallium nitride high electron mobility transistors (GaN HEMT). However, the example switches 110, 116 may be any type of switches (e.g., field effect transistors, metal oxide field effect transistors, etc.). When the high side switch 110 is enabled and the low side switch 116 is disabled (e.g., during high side control), the input voltage is coupled to the output stage 124, thereby causing an output voltage corresponding to the output stage 124 to increase toward the input voltage. When the high side switch 110 is disabled and the low side switch 116 is enabled (e.g., during low side control), the output stage 124 is grounded, thereby causing the output voltage corresponding to the output stage 124 to decrease. When both switches 110, 116 are disabled (e.g., during deadtime), the output stage 124 is isolated from the ground connection at the source of the switch 116 and the input voltage at the drain of the switch 110, to prevent the input voltage from shorting to ground. As described above, the controller 102 toggles between a high logic value and a low logic value on the input nodes (e.g., INH and INL) to toggle the direction of current to/from the output stage 124 (e.g., from the input voltage to the output stage 124 or from the output stage 124 to ground) at a preset frequency and/or pulse width modulation to achieve a desired output voltage. In some examples, the controller 102 outputs control signal(s) corresponding to deadtime before switching from low side to high side control and/or from high side to low side control to prevent shoot through. In some examples, such as using the example HS level shifting trigger 106b of FIG. 3, the maximum load current that can flow through the switching node 128 without causing problems in the high side level shifter latch 108 depends on Vt and Rdson. Accordingly, the maximum load current (I_load)=0.6 Vt/Rdson_LS, where Vt is the threshold voltage of the switches 300, 302 of FIG. 3 and Rdson_LS is the drain-to-source resistance of the low side switch 116 when enabled (e.g., on). Based on the above-equation, the maximum current can be increased by selecting the low side switch 116 to have a lower Rdson than the high side switch 110.

The example capacitor 118 of FIG. 1 is a bootstrap capacitor that bootstraps the voltage at the switching node 128 to a higher voltage at the bootstrap node 126. For example, the bootstrap capacitor 118 provides bias voltages that exceed the power of the input voltage by storing charge corresponding to the GVDD voltage (e.g., a voltage source/input voltage). In this manner, the voltage at the bootstrap node 126 is GVDD higher than the voltage at the switching node 128. For example, if the high side switch 110 is enabled and the input voltage is 400 V, then the voltage at the switching node 128 is approximately 400 V. In such an example, if the voltage provided by GVDD and stored in the capacitor 118 is 6 V, then the voltage at the bootstrap node 126 is 406 V. In this manner, the high side level shifter latch 108 may output the voltage at the bootstrap node 126 at the high side gate node 130 to enable the high side switch 110 or may output the voltage at the switching node 128 at the high side gate node 130 to disable the high side switch 110.

The diode 120 (e.g., a bootstrap diode) of FIG. 1 assists in charging the example boost strap capacitor 118. For example, when the voltage at the switch node 128 drops down to a low voltage (e.g., during low side control), the diode 120 allows GVDD to charge up the bootstrap capacitor 118. When the voltage at the switch node 128 comes up to a high voltage (e.g., during high side control), the diode 120 isolates the GVDD from the bootstrap node 126, thereby creating a voltage GVDD higher than the switching node at the bootstrap node 126. In the illustrated example of FIG. 1, the diode 120 is a GaN transistor whose gate is coupled to its source. Accordingly, the GaN transistor operates like a diode, wherein the source of the GaN transistor is the anode of the diode and the drain of the GaN transistor is the cathode of the diode. Alternatively, any type of circuit that is, or acts as, a diode may alternatively be used.

The example bond pads 122, 123 of FIG. 1 are interconnection pads that connect components in the power converter 100. In some examples, the bond pads 122, 123 connect to components that are implemented in different dies (e.g., a low side die and a high side die). For example, the input buffers 104, the HS level shifting trigger 106a, 106b, the low side level shifting trigger 112 the low side level shifter latch 114, the switch 116, and the diode 120 may be implemented in a low side die, while the HS level shifter latch 108 and the switch 110 may be implemented in a high side die. In such an example, any component that connects is connected to a component implemented in a different die requires one or more of the bond pads 122, 123 to connect between the different dies. The bond pads 122, 123 correspond to some parasitic capacitance that may generate an undesired path to ground that may cause displacement current and/or may cause the gates of both switches in the HS level shifter latch 108 to be pulled above the voltage at the bootstrap node 126 or pulled below the voltage at the switching node 128, which will cause the latch to not be able to latch to a state (e.g., a high output state or a low output state). In some examples, the parasitic capacitance of some of the bond pads 122 may be negligible compared to impedance/resistance of the devices that are connected to bond pads 122. In some examples, the amount of charge caused by the parasitic capacitance of some bod pads 122 may be small. However, the bond pads 123 the voltage swing applied to the bond pads 123 is large (e.g., 0V to 400V). Accordingly the parasitic capacitance of the bond pads 123 can provide a large amount of unwanted charge to devices connected to the bond pads. As further described below, in conjunction with FIG. 9, the bond pads 123 reduce the effect of parasitic capacitance by including a 2-DEG layer on the back of the bond pads 122 with contacts connected to the 2-DEG layer. The contacts may be coupled to the switching node 128 to reduce the amount of parasitic capacitance in the power converter 100.

During low side to high side transitions and/or during dead time between low side and high side transitions, the voltage at the switching node 128 of FIG. 1 may become largely negative (e.g., −4.3 V). For example, during dead time, because the gate of both switches 110, 116 are grounded, an inductor in the output stage 124 will try to force current from ground to the output stage 124. Accordingly, the voltage at the switching node 128 becomes largely negative to allow the current being forced by the inductor to flow toward the output stage 124. When the switching node 128 reaches such negative voltages, some high side level shifters may not be able to flip states to trigger high side control based on the INH signal trigger because of the negative voltage at the switching node 128. However, as further described below, the HS level shifter 105a, 105b includes circuitry to provide a moving level shifting ground to allow the level shifter 105a, 105b to enable high side control, even when the switching node 128 is largely negative.

FIG. 2 is a circuit implementation of the level shifter 105a of FIG. 1. The level shifter 105a of FIG. 2 includes the high side level shifting trigger 106a, the high side level shifter latch 108, the example bootstrap node 126, the example switching node 128, and the example ground node 132 of FIG. 1. The level shifter 105a of FIG. 2 further includes a first example input voltage 200 (e.g., representative of the GVDD of FIG. 1), and a second example input voltage 202 (e.g., representative of the voltage at the input low side node (INL) from the controller 102 of FIG. 1), and a third example input voltage 204 (e.g., representative of the voltage at the input high side node (INH) from the controller 102 of FIG. 1). The level shifter 105a of FIG. 2 further includes an example switches 206, 208, 212, 216, 230, 232, example resistors 210, 214, 226, 228, example diodes 218, 220, and an example capacitor 222. Although the level shifting latch 108 of FIG. 1 is implemented with one latch, the level shifting latch 108 may be implemented with any number of latches, as further described below in conjunction with FIG. 7.

The input voltage 200 (e.g., the voltage source) of FIG. 2 is representative of the GVDD voltage applied in FIG. 1. The input voltage 200 is coupled to ground (e.g., the analog ground node 132). The example first input voltage 204 is representative of the control signal output by the controller 102 on the input high side node (INH) of FIG. 1 and the second input voltage 202 is representative of the control signal output by the controller 102 on the input low side node (INL) of FIG. 1. As described above, a high logic value at the INH node corresponds to enabling the HS switch 110 and a high logic value at the INL node corresponds to disabling the HS switch 110. The input voltages 202, 204 are couple coupled to ground (e.g., the analog ground node 132).

The switches 206, 208 of FIG. 2 are transistors to, when enabled (e.g., based on the logic signal from the respective input voltage 202, 204 applied to the gate of the respective switches 206, 208), allow current to flow from the input voltage 200 to ground via the respective resistors 210, 214 to create a voltage at the gates of the respective switches 212, 216. In FIG. 2, the switches 206, 208 are p-channel metal oxide semiconductor transistors. Alternatively, the switches 206, 208 may be n-channel metal oxide semiconductor transistors (e.g., with connection adjustments to ensure that a logic signal corresponding to high side control enables the high side switch 110), GaN transistors (e.g., as further described below in conjunction with FIG. 3), and/or any other type of switch.

The switches 212, 216 of FIG. 2 are transistors to, when enabled, allow current to flow from the bootstrap node 126 to the moving level shifting ground node 224 via the respective resistors 226, 228. The switches 212, 216 are enabled when a voltage is applied to the gate of the respective switch 212, 216 that is above a threshold voltage. As illustrated in FIG. 2, the switches 212, 216 are GaN switches. Alternatively, any type of switch may be used.

The diodes 218, 220 of FIG. 2 are implemented by GaN transistors. Alternatively, the diodes 218, 220 may be any device that implements the functionality of a diode (e.g., to allow current to flow in one direction and prevent current from flowing in a second direction). For example, the source of the GaN implementation corresponds to an anode of the diode 218 (e.g., coupled to the moving level shifting ground node 224) and the drain of the GaN implementation corresponds to the cathode of the diode 218 (e.g., coupled to the switching node 128). Additionally, the source of the GaN implementation corresponds to an anode of the diode 220 (e.g., coupled to the moving level shifting ground node 224) and the drain of the GaN implementation corresponds to the cathode of the diode 220 (e.g., coupled to the analog ground node 132). The diodes 218, 220 generate a voltage drop corresponding to a threshold voltage. The diode 218 allows current to flow from the moving level shifting ground node 224 to the switching (SW) node 128 and prevents current from flowing from the SW node 128 to the moving level shifting ground node 224. Additionally, the diode 220 allows current to flow from the moving level shifting ground node 224 to the analog ground (AGND) node 132. In this manner, when the voltage at the SW node 128 is positive, the moving level shifting ground node 224 is isolated from the SW node 128 and the voltage at the moving level shifting ground node 224 is one threshold voltage (e.g., 2 V) above the voltage at the AGND node (e.g., 0V). Additionally, when the voltage at the SW node 128 is negative, the moving level shifting ground node 224 is isolated from the AGND node 132 and the voltage at the moving level shifting ground node is one threshold voltage (e.g., 2 V) above the voltage at the SW node 128. Accordingly, the example diodes 218, 220 are implemented to generate the moving level shifting ground node 224 that tracks the SW node 128 (e.g., is one threshold voltage above the voltage at the SW node 128) when the voltage at the SW node 128 is negative and tracks AGND 132 (e.g., is one threshold voltage above the voltage at the AGND node 132/corresponds to the voltage differential across the diode 220 from the switching node 224 to the AGND 132), when the voltage at the SW node 128 is positive.

The capacitor 222 of FIG. 2 absorbs the charging current of the blocking diode 218, when the voltage at the switching node 128 is rising to a high voltage. In this manner, the capacitor 222 keeps the voltage drop from the AGND 132 to moving level shifting ground node 224 low until the level shifting action is complete (e.g., after the voltage at the switching node 128 settles to the high voltage level).

The example resistors 226, 228 of FIG. 2 provide a path for current to flow to ground (e.g., based on the enabling of switches 212, 216) to generate voltages at the gates of the respective switches 230, 232 to store state information (e.g., a high state output or a low state output) that corresponds to outputting a voltage on the high side gate node 130 high enough to example the switch 110 or low enough to disable the switch 110. In some examples, the resistors 226, 228 may be replaced with p-channel transistors and/or p-channel GaN transistors.

The example switches 230, 232 of FIG. 2 are transistors that latch to state information based on voltages applied to the gates of the respective switches 230, 232. The switches 230, 232 are implemented so that when the switch 230 is on, the switch 232 is off and when the switch 230 is off, the switch 232 is on. When the switch 230 is off and the switch 232 is on, the voltage at the high side gate node 130 (e.g., the latch output) corresponds to a low logic state (e.g., a voltage low enough to disable the example switch 110). When the switch 230 is on and the switch 232 is off, the voltage at the high side gate node 130 corresponds to a high logic state (e.g., a voltage high enough to enable the switch 110).

In operation, when the first input voltage 200 is high and the second input voltage 202 is low (e.g., corresponding to high side control), the switch 206 is enabled and the switch 208 is disabled. Accordingly, the input voltage 200 (e.g., GVDD) is applied to the resistor 210 to create a voltage drop across the resistor 210 (e.g., because the voltage at the moving level shifting ground node 224 is low or negative during low side/deadtime control). The voltage drop corresponds to a voltage applied to the gate of the switch 212 that is high enough to enable the switch 212, thereby providing a path to ground from the bootstrap node 126 via the example resistor 226. Because the voltage at the moving level shifting ground node 224 tracks the SW node voltage, the voltage at the moving level shifting ground node 224 will always be low enough to cause a voltage drop across the resistors 226 that corresponds to a flipping of the switches 230, 232, even when the voltage at the bootstrap node 126 is 0. In this manner, the voltage applied to the gate of the switch 212 is high enough to enabled the switch 212 (e.g., flipping the state of the latch). Thus, the voltage at the high side gate node 130 is approximately the same as the voltage at the bootstrap node 126 (e.g., a voltage high enough to enable the switch 110 for high side control).

In systems that do not include the moving level shifting ground node 224 (e.g., systems without the diodes 218, 220), the AGND node 132 is used to trigger the latch. However, such systems are not be able to flip the latch because, during deadtime, the voltage at the bootstrap node 126 may be very small or zero. For example, if the voltage at the SW node 128 is -6 V during deadtime, then the voltage at the bootstrap node 126 will be 0V. Because the voltage at the AGND node 132 is also 0 V, there will not be a voltage drop across either of the resistors 226, 228. Accordingly, such systems will not be able to flip the latch to initiate high side control. However, because the diode 218 generates a voltage drop corresponding to a voltage at the moving level shifting ground node 224 that is a threshold voltage above the voltage at the SW node 128, the voltage at the moving level shifting ground node 224 will be some voltage less than the voltage at the bootstrap node 126. For example, if the voltage at the bootstrap node 126 is 0 V, then the voltage at the SW node 128 is -6 V and the voltage at the moving level shifting ground node 224 is -4 V. Accordingly, there will still be a voltage drop across the example resistor 226 (e.g., 0V to -4V) to facilitate a state switch (e.g., flip) of the switches 230, 232 during deadtime.

Figure 3:
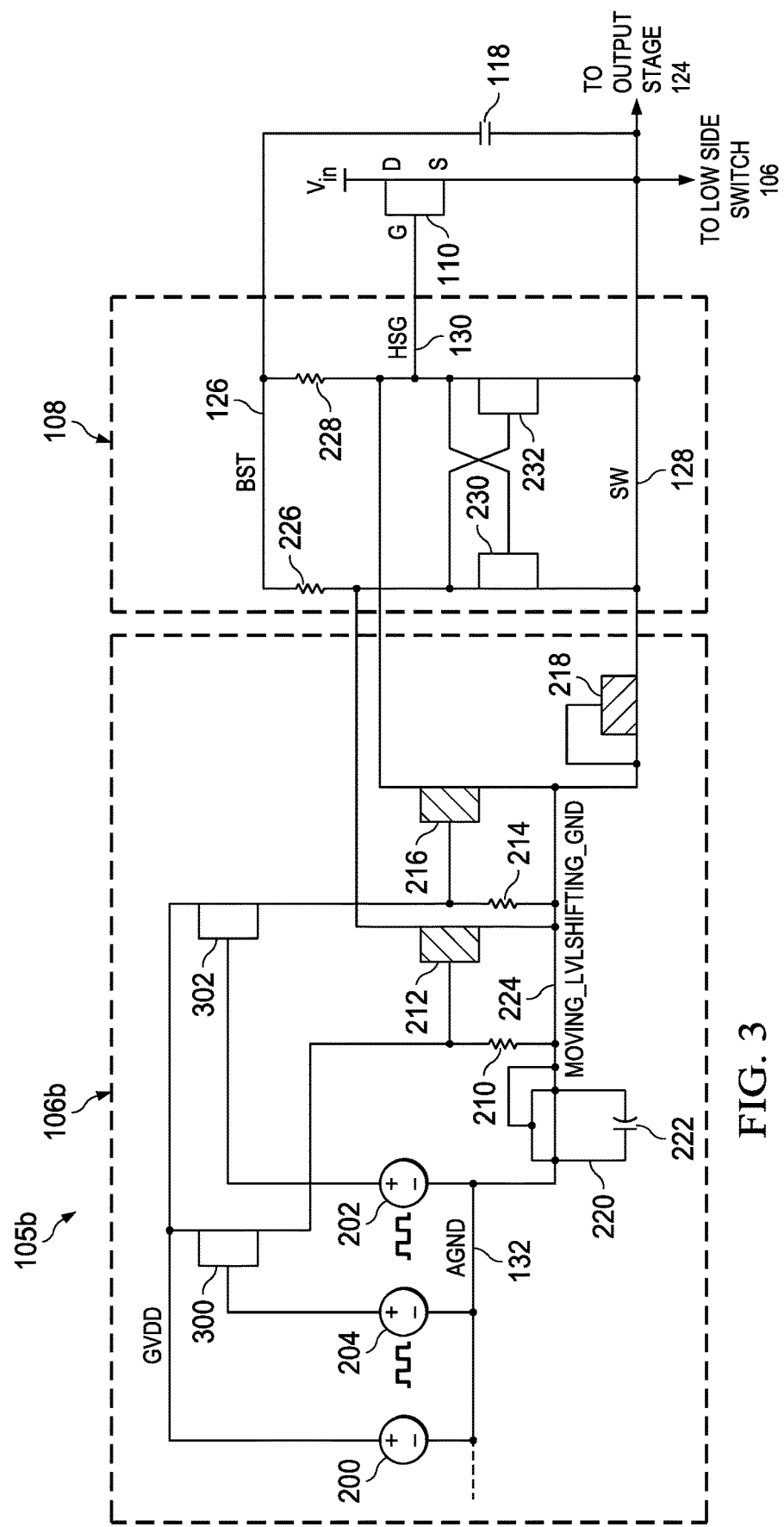
FIG. 3 illustrates an alternative example circuit implementation high side level shifter of FIG. 1.

FIG. 3 is an alternative circuit implementation of the level shifter 105b of FIG. 1. FIG. 3 includes the high side level shifting trigger 106b, the example high side level shifter latch 108, the example bootstrap node 126, the example switching node 128, and the example ground node 132, the first example input voltage 200, and the second example input voltage 202, and the third example input voltage 204, the example switches 212, 216, 230, 232, the example resistors 210, 214, 226, 228, the example diodes 218, 220, and the example capacitor 222 of FIGS. 1 and/or 2. FIG. 3 further includes GaN-based switches (e.g., transistors) 300, 302.

The GaN transistors 300 of FIG. 3 operate in a substantially similar manner than the switches 206, 208 of FIG. 1. However, because the GaN transistors 300 are implemented as n-channel GaN transistors, the input voltages 202, 204 are flipped so that the voltage at the INH input corresponds to high side control and the voltage at the INL input corresponds to low side control. Alternatively, a inverting gate/circuit may be used and the input voltages 202, 204 can remain as they are in FIG. 2. However, operation of the circuit of FIG. 3 is substantially similar FIG. 2, in that enabling the example GaN transistors 300 correspond to a high logic value being output at the high side gate node 130 (e.g., for low side control and/or dead time) and enabling the example transistor 302 corresponds to a low logic value being output at the high side gate node 130 (e.g., for high side control).

FIG. 4 is an example timing diagram 400 corresponding to a low side control to high side control transition of the power converter 100 of FIG. 1. The example timing diagram 400 includes an example high side input voltage 402, an example gate voltage 404 (e.g., corresponding to a voltage at the gate of the example switch 212 of FIG. 2), an example moving level shifting ground voltage 406, and an example switching node voltage 408. The timing diagram 400 of FIG. 4 corresponds to a power converter whose load draws a -4 amperes (A) during deadtime.

Before time t0, the power converter 100 is operating in low side control (e.g., when the low side switch 116 is enabled and the high side switch 110 is disabled, thereby causing the voltage at the switching node 128 discharge toward ground). After time t0, the power converter 100 is operating in dead time (e.g., when the low side switch 116 is disabled and the high side switch 110 is disabled) to prevent shoot through. As described above, the inductor of the output stage 124 draws current from ground during deadtime. Accordingly, during deadtime, the switching node voltage 408 become negative (e.g., -4.5 V). Because the example diode 218 generates a voltage drop from the moving level shifting ground node 224 to the switching node 128, the moving level shifting ground voltage 406 is one diode threshold voltage above the switching node voltage 408 (e.g., -2.7 V). Additionally, the gate voltage 404 likewise become negative due to the voltage differential across the resistor 210 while the voltage at the moving level shifting ground node 224 is negative. At t1, the high side input voltage increases to trigger high side control. Accordingly, the switch 206, 300 is enabled to generate a voltage differential across the resistor 210, corresponding to the increase of the gate voltage 404. As described above, enabling the switch 212 based on the gate voltage 404 causes the level shifter latch 108 to flip output states by disabling the switch 232 and enabling the switch 230 to cause the switching node voltage 408 to increase to a voltage high enough to enable the high side switch 110. At time t1 (e.g., during high side control), the moving level shifting ground voltage 406 begins to track the voltage at the analog ground (e.g., AGND node 132).

Figure 5:
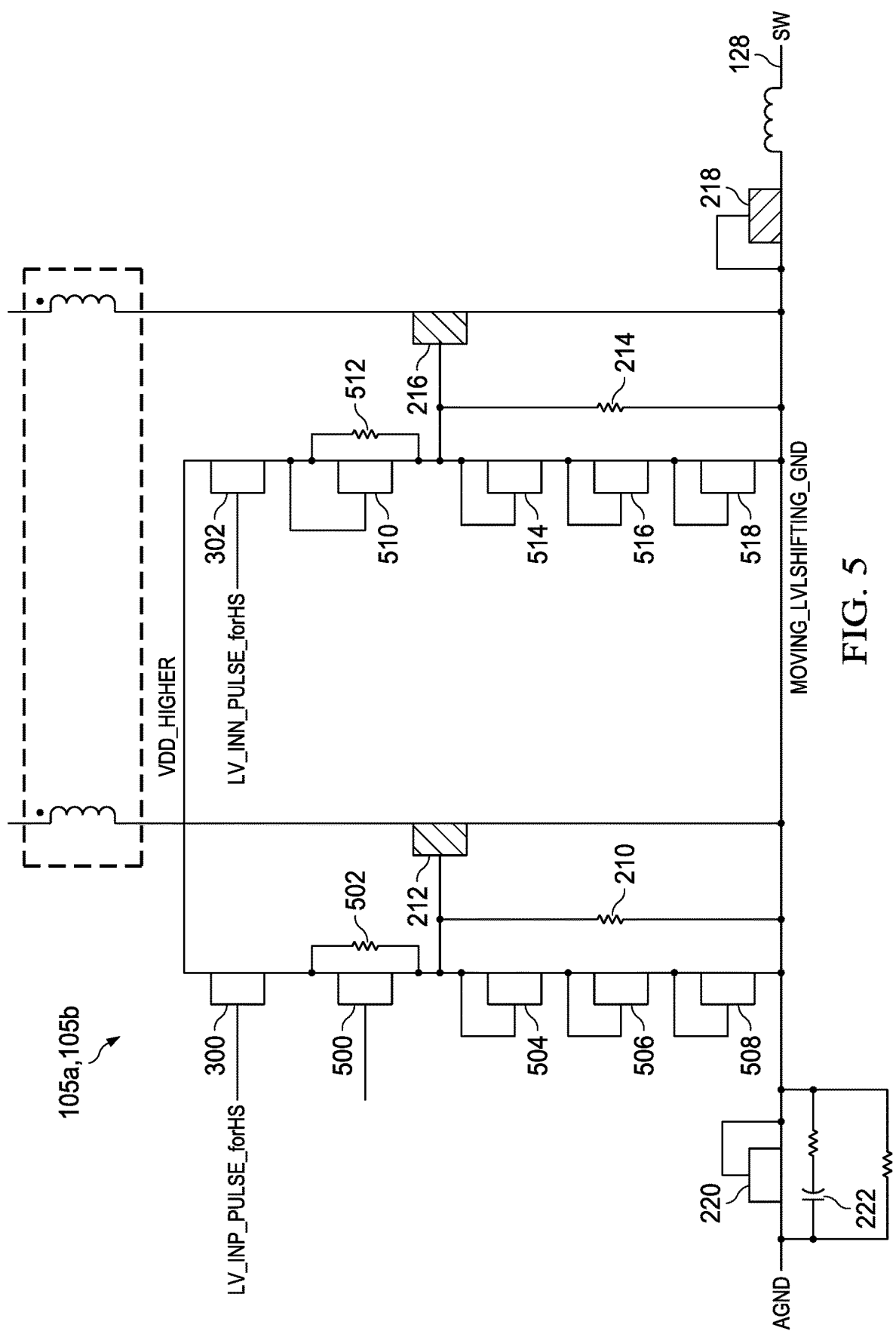
FIG. 5 illustrates an alternative example high side level shifting trigger of FIG. 1.

FIG. 5 is an alternative circuit implementation of the high side level shifting trigger 106*a*, 106*b* of FIG. 1 that may be implemented for larger amounts of current being drawn to ground during low side control (e.g., −4 A to −6 A or more). The high side level shifting trigger 106*a*, 106*b* of FIG. 5 includes the switching node 128, the switches 212, 216, 300, 302, the example diode 218, 220, the example capacitor 222, and the moving level shifting ground node 224 of FIGS. 1,2 and/or 3. The high side level shifting trigger 106*a*, 106*b* of FIG. 5 further includes example diodes 500, 504, 506, 508, 510, 514, 516, 518 and resistors 502, 512

The high side level shifting trigger 106*a*, 106*b* of FIG. 5 includes the diodes 500, 504, 506, 508, 510, 514 and the resistors 502, 512 to handle a larger amount of current being drawing by an inductor the output stage 124 of FIG. 1 during low side control/dead time corresponding to a more negative switching node voltage 128. For example, using Ohm's law maximum load current that can be handled by the level shifting trigger 106*a*, 106*b* of FIG. 2 or 3 is 0.6 VT/Rdson_LS, where VT is the threshold voltage and Rdson_LS is the drain-to-source resistance of the switch 116. As described above, one way to increase the maximum load current is to make Rdson_LS be lower than Rdson_HS (e.g., the drain-to-source resistance of the switch 110). Alternatively, the third diode 500, 510 may be added to the high side level shifting trigger 106*a*, 106*b* to adjust the equation using Ohm's law corresponding to a higher maximum load current. For example, with the third diode, I_load=0.9 VT/Rdson_LS, corresponding to a higher load current. In some examples, one or more charge pumps may be added to the gates of the switches 300, 302 to inject enough current to create a voltage drop across the respective resistors 210, 214 to generate enough voltage at the gate of the switches 212, 216 to enable the switches 212, 216.

FIG. 6 is an example timing diagram 600 corresponding to a low side control to high side control transition of the power converter 100 using the high side level shifting trigger 106*a*, 106*b* of FIG. 5. The example timing diagram 600 includes an example gate voltage 602 (e.g., corresponding to a voltage at the gate of the example switch 300 of FIG. 5), an example drain voltage 604 (e.g., corresponding to a voltage at the drain of the example diode 500 of FIG. 5), an example gate voltage 605 (e.g., corresponding to a voltage at the gate of the example switch 212 of FIG. 5), an example moving level shifting ground voltage 606, and an example switching node voltage 608. The timing diagram 600 corresponds to when the load current reaches −6 A during deadtime.

Initially, the timing diagram 600 begins when the power converter 100 is operating in dead time (e.g., when the low side switch 116 is disabled and the high side switch 110 is disabled) to prevent shoot through. As described above, the inductor of the output stage 124 draws current from ground during deadtime. Accordingly, during deadtime, the switching node voltage 608 become negative (e.g., −6 V). Because the example diode 218 generates a voltage drop from the moving level shifting ground node 224 to the switching node 128, the moving level shifting ground voltage 606 is one diode threshold voltage above the switching node voltage 608 (e.g., −4 V). Additionally, the gate voltage 605 and the drain voltage 604 likewise become negative due to the voltage differential across the resistor 210 while the moving level shifting ground node 224 is negative. At t1, the high side input voltage increases to trigger high side control. Accordingly, the switch 206, 300 is enabled to generate a voltage differential across the resistor 210 through the diode 500, corresponding to the increase of the drain voltage 604 and the gate voltage 605. As described above, enabling the switch 212 based on the gate voltage 605 causes the level shifter latch 108 to flip output states by disabling the switch 232 and enabling the switch 230 to cause the switching node voltage 608 to increase to a voltage high enough to enable the high side switch 110. At time t1 (e.g., during high side control), the moving level shifting ground voltage 606 begins to track the voltage at the analog ground (e.g., AGND node 132).

Figure 7A:
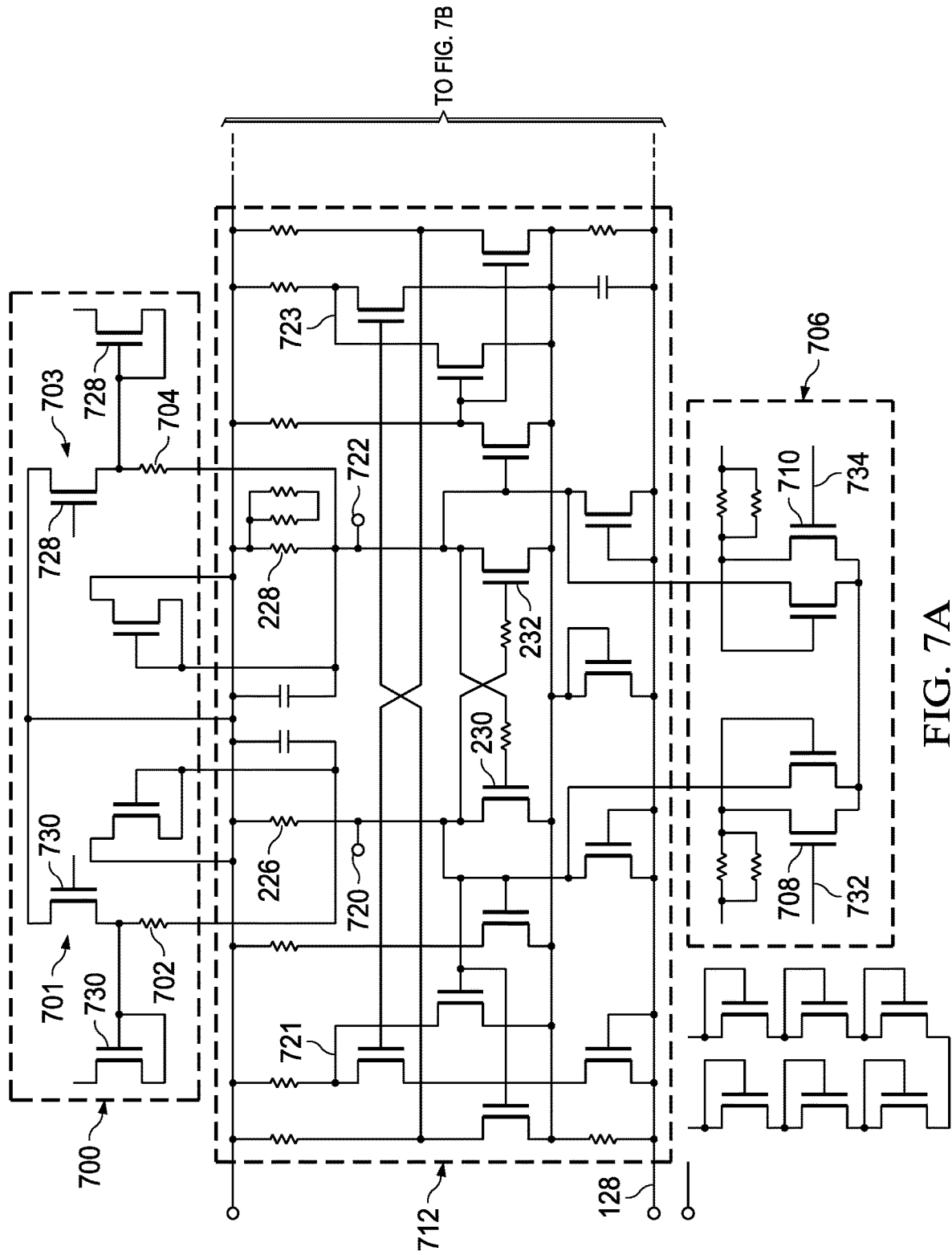
FIGS. 7A-7B illustrates an alternative example high side level shifter latch of FIG. 1.
Figure 7B:
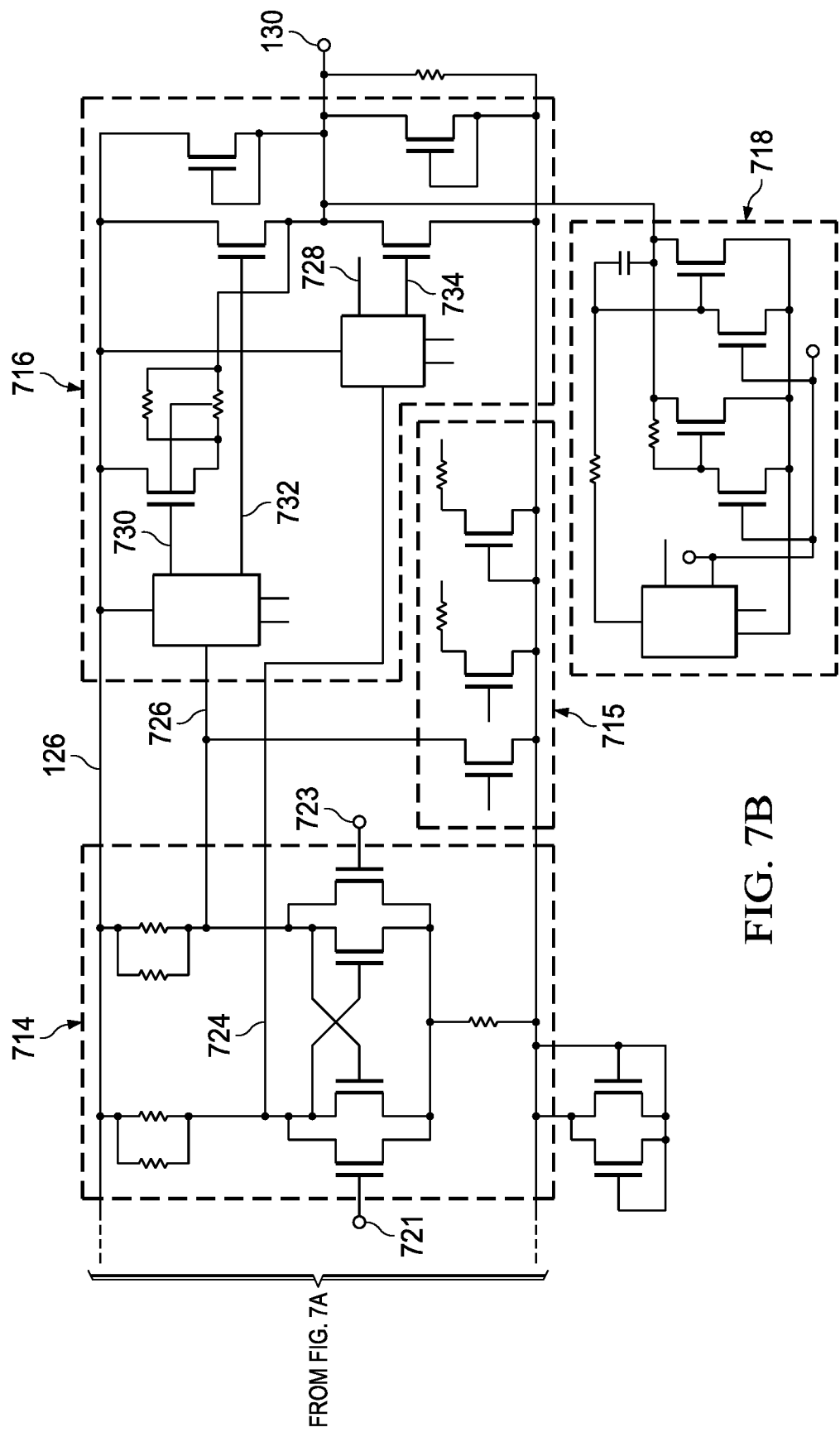

FIG. 7 illustrates an alternative circuit implementation of the high side level shifter latch 108 of FIG. 1 including two-way hysteresis. The high side level shifter latch 108 of FIG. 7 includes an example first hysteresis circuit 700, example switches 701, 703, 708, 710 example resistors 702, 704, an example second hysteresis circuit 706, a first example latch 712, a second example latch 714, and example circuit 715, example drivers 716, example circuit 718, and example nodes 720, 721, 723, 722, 724, 726, 728, 730, 732, 734.

During transitions from low side control to high side control, displacement currents may flow because of the parasitic capacitance of the bond pads 123. In some examples, the displacement current may cause the voltages at both gates of the switches 230, 232 to be driven to ground causing an error in the high side level shifter latch 108 and losing the stored state information. The first and second hysteresis circuits 700, 706 recover the previous state of the high side level shifter latch 108 when such errors occur. The first hysteresis circuit 700 provides a another parallel resistance (e.g., one or more resistors in parallel) to one of the resistors 226, 228, depending on the previously stored state and the second hysteresis circuit 706 provides a stronger path toward the switching node 128 via one of the switches 230, 232, depending on the previously stored state (e.g., higher resistance and paths to the side of the latch that was previously high and lower resistance and paths to the side of the latch that was previously low). In this manner, if the voltage applied to the gates of the switches 230, 232 are both zero due to parasitic capacitance, the stronger side will pull up in the correct direction to maintain the stored state information (e.g., the latch maintains its previous state).

The first hysteresis circuit 700 of FIG. 7 includes the example switches 701, 703 and the example resistors 702, 704. When the first switch 701 is enabled (e.g., based on the output of rail-to-rail driver node 730), the resistor 702 provides extra resistance to the resistor 226 (e.g., through a parallel connection, lowering overall resistance to the bootstrap node 126), thereby providing a stronger pull-up path to the bootstrap node 126. Having a stronger path corresponds to a faster pull up to the voltage at the bootstrap node 126, thereby causing the latch to return to the previous state by providing the correct voltage to the gate of the switch 232. When the second switch 703 is enabled, the resistor 704 provides extra resistance to the resistor 228 (e.g., through a parallel connection), thereby providing a stronger pull-up path to the bootstrap node 126 through resistor 228.

The second hysteresis circuit 706 of FIG. 7 includes the examples switches 708, 710 to provide a strong path to the switching node 128. For example, when the first switch 708 is enabled, the switch 708 provides a stronger path to ground on the side of the latch corresponding to the resistor 226, causing a slower pull up to the voltage at the bootstrap node 126 to cause the latch to return to the previous state by providing the correct voltage to the gate of the switch 232.

The first latch 712 of FIG. 7 corresponds to the latch described in FIGS. 2 and 3. For example, the first latch 712 includes the resistor 226, 228 and the switches 230, 232 of FIGS. 2 and 3. Additionally, the latch 712 includes additional components (e.g., diode clamps, switches, resistors, capacitors, etc.) to handle the common mode current. For example, the additional components clamp the voltages at different nodes to the bootstrap rate potential or switching node rate potential.

The second latch 714 of FIG. 7 operates in a substantially similar manner as the first latch 712. The second latch 714 receives the voltages on each side of the first latch 712 (e.g., the voltages at the first latch output nodes 721, 723) and adjust states based on the received voltages to generate the second latch output logic signals on the second latch output nodes 724, 726. The voltage on the second latch output nodes 724, 726 are coupled to rail-to-rail driver output nodes 728, 730, 732, 734 which are coupled to the gates of the switches 701, 703, 708, 710. Buffer output nodes 730, 728 are designed to output a voltage higher than the voltage on the bootstrap node potential to drive n-channel devices effectively. For example, rail to rail driver output nodes 730, 732 are coupled to the switches 701, 708 and rail-to-rail driver output nodes 728, 734 are coupled to the switches 703, 710. In this manner, the previously stored state information is used by the switches 701, 703, 708, 710 of the hysteresis circuits 700, 706 to ensure that parasitic capacitance causing errors in the first latch 712 (e.g., 0 V at both nodes 720, 722 do not cause error in the second latch 714 by setting the first latch 712 to the previously stored state information based on the additional resistance/path).

The example circuit 715 of FIG. 7 enforces a predefined current state during startup. In this manner, the predefined state information will be set by the first and second latches 712, 714 at startup. The circuit 716 correspond to rail to rail drivers that output the voltage at the bootstrap node 126 or the voltage at the switching node 128 corresponding to the output(s) of the second latch 714 on the high side gate node 130. The example circuit 716 may be used to ensure that enough current is used to drive the gate of the switch 110 at a predetermined speed. The circuit 718 provides under voltage protection and startup clamps to, define the state of the latch during powerup.

FIG. 8 is an example timing diagram 800 corresponding to a low side control to high side control transition of the power converter 100 using the high side level shifter latch 108 of FIG. 7. The example timing diagram 800 includes a first example control voltage 802 (e.g., corresponding to a voltage at the drain of the switch 212 of FIGS. 2 and/or 3 corresponding to the first latch 712 on a first side), a second example control voltage 804 (e.g., corresponding to a voltage at the drain of the switch 216 of FIGS. 2 and/or 3 corresponding to the first latch 712 on second first side), an example first latch output voltage 806 corresponding to the voltage at the node 720, an example first latch output voltage 808 corresponding to the voltage at the node 722, an example second latch output voltage 810 corresponding to the voltage at node 724, an example second latch output voltage 812 corresponding to the voltage at node 726, and an example voltage 814 corresponding to the switching node 128. The example voltages 802-812 are with respect to the voltage 814 at the switching node 128. For example, when the example voltage 810 is at 6V, it is 6V above the voltage 814 at the switching node 128.

Before time t0, the power converter 100 is operating in low side control or deadtime. At time t0, the first low side control voltage 802 goes low and the second low side control voltage 804 goes high indicating a transition from low side control to high side control. Accordingly, between times t0 and t1, the first latch output voltage 806 and the second latch output voltage 810 drop to a low voltage while the first latch output voltage 808 and the second latch output voltage 812 rise to a high voltage. Between times t1 and t2, the parasitic capacitance on the components of the power converter 100 cause the control voltages 802, 804 and similarly the first latch output voltage 806, 808 to drop to a low voltage. However, the hysteresis circuits 700, 706 cause the level shifter latch 108 to maintain its previously stored state (e.g., corresponding to the high side state that occurred between time t0 and t1). In this manner, the example second latch outputs 810, 812 maintain their voltage levels and the example switching node voltage 814 increases to the high voltage without any errors corresponding to the parasitic capacitance.

FIG. 9 illustrates an example of one of the bond pads 122 of FIG. 1. The example bond pad includes an example bond pad connection terminal 900, an example 2-DEG layer 902, and example contacts 904 connected to the example switching node 128.

As described above, a bond pad corresponds to an amount of parasitic capacitance. The parasitic capacitance may cause an undesired path to ground. Accordingly, shielding may be used to redirect the path to ground caused by the parasitic capacitance to a path to the SW node 128, thereby limiting the parasitic induced current effects on nodes 720, 722 of FIG. 7.

The bond pad 123 of FIG. 9 includes a bond pad terminal 900 that connects one component to another component using bond wires. On the back of the bond pad terminal 900, the bond pad 123 includes the 2-DEG layer 902 (e.g., a 2-DEG sheet) corresponding to some resistance and the contacts 904 connected to the 2-DEG layer 902. The 2-DEG layer 902 is a conductive layer, which is how the shielding is achieved. The contacts 904 are connected to the SW node 128. In this manner, the parasitic capacitance is tied to the SW node 128, as opposed to ground. In this manner, the parasitic current on nodes 720, 722 is minimal and the effect of parasitic capacitance is reduced.

While an example manner of implementing the high side level shifter 105a, 105b of FIG. 1 is illustrated in FIGS. 2, 3, 5, and 7, one or more of the elements, processes and/or devices illustrated in FIGS. 2, 3, 5, and 7 may be combined, divided, re-arranged, omitted, eliminated and/or implemented in any other way. Further, the HS level shifting trigger 106a, 106b, the HS level shifter latch 108, and/or, more generally, the example high side level shifter 105a, 105b of FIGS. 1-3, 5, and 7 may be implemented by hardware, software, firmware and/or any combination of hardware, software and/or firmware. Thus, for example, any of the HS level shifting trigger 106a, 106b, the HS level shifter latch 108, and/or, more generally, the example high side level shifter 105a, 105b of FIGS. 1-3, 5, and 7 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the HS level shifting trigger 106a, 106b, the HS level shifter latch 108, and/or, more generally, the example high side level shifter 105a, 105b of FIGS. 1-3, 5, and 7 is/are hereby expressly defined to include a non-transitory computer readable storage device or storage disk such as a memory, a digital versatile disk (DVD), a compact disk (CD), a Blu-ray disk, etc. including the software and/or firmware. Further still, the example HS level shifter 105a, 105b of FIG. 1 may include one or more elements, processes and/or devices in addition to, or instead of, those illustrated in FIGS. 1-4, 5 and 7, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 10:
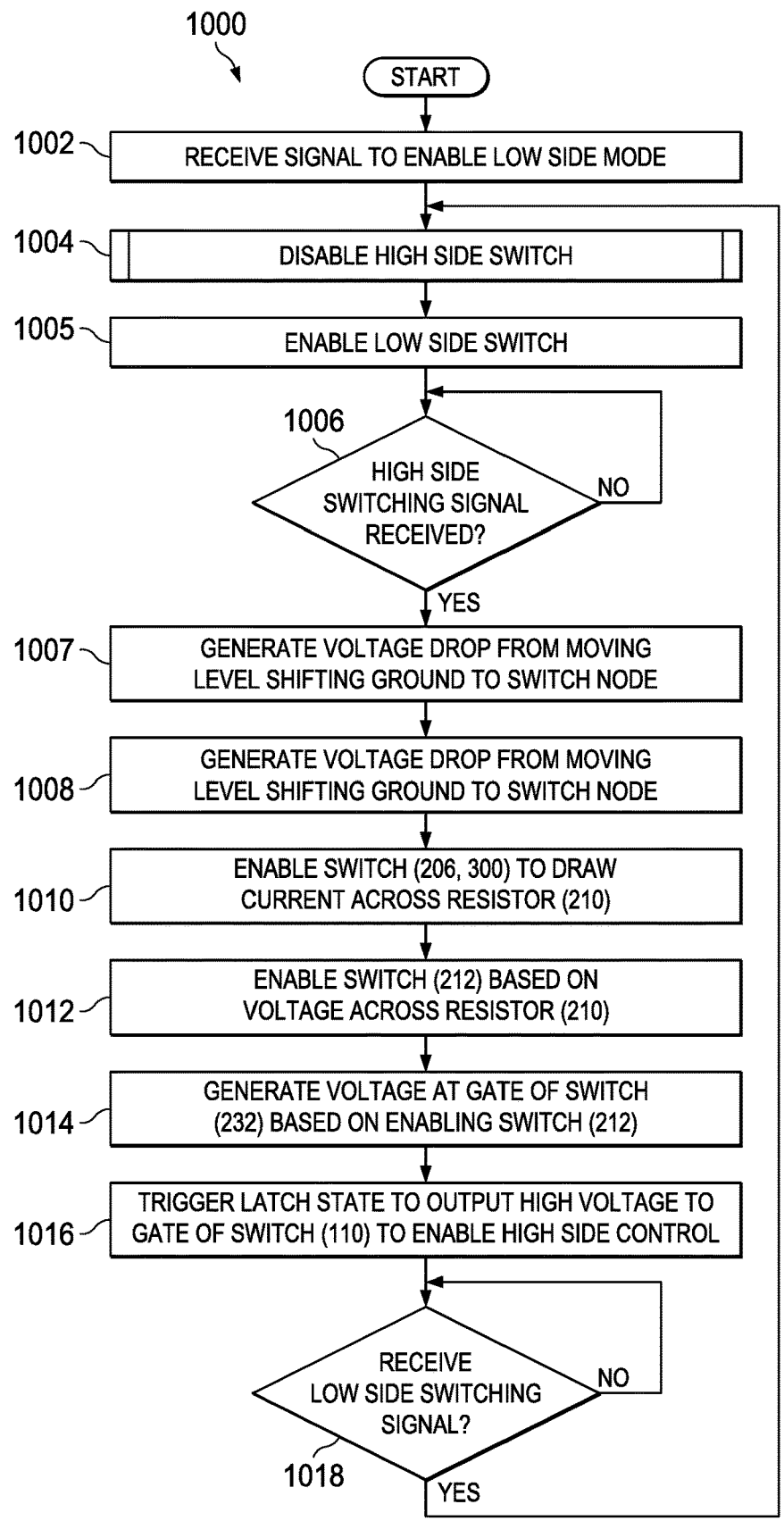
FIG. 10 is a flowchart representative of example machine readable instructions that may be executed and/or hardware configurations to implement the example power converter of FIG. 1.
Figure 11:
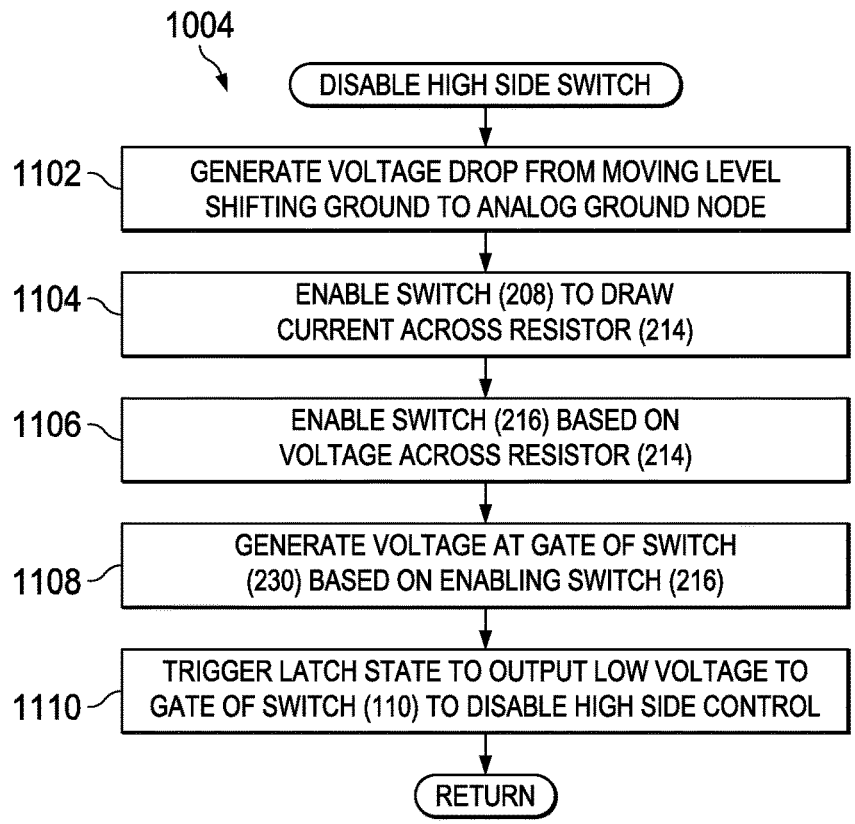
FIG. 11 is a flowchart representative of example machine readable instructions that may be executed and/or hardware configurations to implement the example power converter of FIG. 1.

Flowcharts representative of example hardware logic, machine readable instructions, hardware implemented state machines, and/or any combination thereof for implementing the power converter 100 of FIG. 1 are shown in FIGS. 10 and 11. The machine-readable instructions may be an executable program or portion of an executable program for execution by a computer processor such as the processor 1212 shown in the example processor platform 1200 discussed below in connection with FIG. 12. The program may be embodied in software stored on a non-transitory computer readable storage medium such as a CD-ROM, a floppy disk, a hard drive, a DVD, a Blu-ray disk, or a memory associated with the processor 1212, but the entire program and/or parts thereof could alternatively be executed by a device other than the processor 1212 and/or embodied in firmware or dedicated hardware. Further, although the example program is described with reference to the flowcharts illustrated in FIG. 10-11, many other methods of implementing the example power converter 100 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example processes of FIGS. 10-11 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 10 is an example flowchart 1000 representative of example machine readable instructions and/or hardware configurations that may be executed by the power converter 100 of FIG. 1 to control the high side switch 110 based on control signals from the controller 102. Although the example flowchart 1000 of FIG. 10 is described in conjunction with the power converter 100 of FIG. 1, the flowchart 1000 may be described in conjunction with any type of switching power converter.

At block 1002, the HS level shifting trigger 106a, 106b receives a disable high side signal. For example, the switch 208 may receive a low logic value at the gate of the switch 208 and the switch 206 may receive a high logic value at the gate of the switch 206 (e.g., corresponding to enabling the switch 208 and disabling the switch 206). In another example, the switch 300 of FIG. 3 may receive a low logic value at the gate of the switch 300 and the switch 302 may receive a high logic value at the gate of the switch 302 (e.g., corresponding to disabling the switch 300 and enabling the switch 302). At block 1004, the power converter 100 disables the high side switch 110, as further described below in conjunction with FIG. 11. During low side control, the voltage at the switching node 128 reaches zero volts and/or a negative voltage. Accordingly, during low side control, the example bootstrap capacitor 118 charges based on the voltage differential between GVDD and the SW node 128 (e.g., via the diode 120). As further described above, in conjunction with FIG. 1, because the bootstrap capacitor 118 is charged during low side control, the voltage at the bootstrap node 126 is GVDD higher than the switching node 128 during high side control as the bootstrap capacitor 118.

At block 1005, the example low side level shifter latch 114 enables the low side switch 116 by apply a high voltage to the gate of the low side switch 116. After the low side level shifter latch 114 enables the low side switch 116, the power converter 100 remains in low side mode until a high side switching signal is received from the example controller 102. In some examples, the example controller 102 outputs control signals to disable both the high side switch 110 and the low side switch 116 for a duration of time between low side/high side transitions to prevent shoot-through. At block 1006, the HS level shifting trigger 106a, 106b determines if a high side switching signal has been received. For example, the HS level shifting trigger 106a, 106b determines that the high side switching signal is received when the voltage at the gate of the switch 206 is a low logic value and the voltage at the gate of the switch 208 is a high logic value. In another example, the HS level shifting trigger 106a, 106b determines that the high side switching signal is received when the voltage at the gate of the switch 300 is a high logic value and the voltage at the gate of the switch 302 is a low logic value.

If the HS level shifting trigger 106a, 106b determines that the high side switching signal is not received (block 1006:

NO), the process continues, keeping the high side switch 110 disabled. If the HS level shifting trigger 106a, 106b determines that the high side switching signal is received (block 1006: YES), the LS level shifting trigger 112 and the example LS level shifter latch 114 disables the low side switch 116 (block 1007) (e.g., by applying a low voltage to the gate of the low side switch 116). At block 1008, the diode 218 generates a voltage drop from the moving level shifting ground node 224 to the switching node 128. For example, during a low-to-high switch or a dead time t0 high side switch, the voltage at the switching node 128 may be negative. Accordingly, the diode 218 generates a voltage drop so that the voltage at the moving level shifting node ground 224 is one threshold voltage (e.g., 0.7V, 1.5 V, 2 V, etc.) above the voltage at the switching node 128. Because the moving level shifting ground node 224 may be negative, due to the largely negative voltage at the switching node 128, the diode 220 prevents current from flowing from the moving level shifting ground node 224 to the AGND node 132. Accordingly, when the voltage at the switching node 128 is negative, the voltage at the moving level shifting ground node 224 tracks the voltage at the switching node 128.

At block 1010, the voltage applied to the gate of the switch 206, 300 enables the switch 206, 300 to draw current from the input voltage 200 (e.g., GVDD) to the moving level shifting ground node 224 via the first resistor 210, thereby generating a voltage drop across the first resistor 210. At block 1012, the voltage across the resistor 210 (e.g., the voltage at the gate of the switch 212), enables the switch 212. At block 1014, because enabling the switch 212 generates a path from the bootstrap node 126 to the moving level shifting ground node 224 via the resistor 226, the resistor 226 generates a low voltage at the gate of the switch 232 to disable the switch 232. At block 1016, in response to the enabling of the switch 212, the latch of the high side level shifter latch 108 triggers a high logic latch state because there is no path to ground via the resistor 228, thereby causing the voltage at the bootstrap node 126 (e.g., a voltage high enough to enable the switch 110) to be output to the gate of the switch 110 to enable high side control.

At block 1018, the HS level shifting trigger 106a, 106b determines if a low side switching signal has been received. For example, the HS level shifting trigger 106a, 106b determines if the low side switching signal is received when the voltage at the gate of the switch 206 high and the voltage at the gate of the switch 208 is low or if the voltage at the gate of the switch 300 is low and the voltage at the gate of the switch 302 is high. If the HS level shifting trigger 106a, 106b determines that the low side switching signal has not been received (block 1018: NO), the process continues in high side control. If the HS level sifting trigger 106a, 106b determines that the low side switching signal has been received (block 1018: YES), the process returns to block 1004 to disable the high side switch 110.

FIG. 11 is an example flowchart 1004 representative of example machine readable instructions and/or hardware configurations that may be executed by the power converter 100 of FIG. 1 to disable the high side switch 110, as described above in conjunction with block 1004 of FIG. 10. Although the example flowchart 1004 of FIG. 11 is described in conjunction with the power converter 100 of FIG. 1, the flowchart 1004 may be described in conjunction with any type of switching power converter.

At block 1102, the example diode 220 generates a voltage drop from the moving level shifting ground node 224 to the analog ground (AGND) node 132. As described above in conjunction with FIG. 2, during high side control, the voltage at the switching node 128 is positive. Accordingly, the diode 218 prevents current from flowing from the switching node 128 to the moving level shifting ground node 224. In this manner, the voltage at the moving level shifting ground tracks the voltage at the AGND node 132, which is 0 V. Accordingly, when the voltage at the SW node 128 is positive, the voltage at the moving level shifting ground node 224 is one threshold voltage (e.g., corresponding to the threshold voltage of the diode 220), above the ground voltage at the AGND node 132.

At block 1104, the voltage applied to the gate of the switch 208, 302 enables the switch 208, 302 to draw current from the input voltage 200 to the moving level shifting ground node 224 via the resistor 214, thereby generating a voltage drop across the resistor 214. At block 1106, the voltage across the resistor 214 (e.g., the voltage at the gate of the switch 216), enables the switch 216. At block 1108, because enabling the switch 216 generates a path from the bootstrap node 126 to the moving level shifting ground node 224 via the resistor 228, the resistor 228 generates a low voltage at the gate of switch 230 to disable the switch 230. At block 1110, the latch of the high side level shifter latch 108 triggers to a low logic latch state in response to the enabling of the switch 216 because the high side gate node 130 is tied to the switching node 128, thereby causing the voltage at the switching node 128 (e.g., corresponding to a voltage low enough to disable the switch 110) to be output to the gate of the switch 110 to enable low side control. After block 1110, the process returns to block 1006 of FIG. 10.

Figure 12:
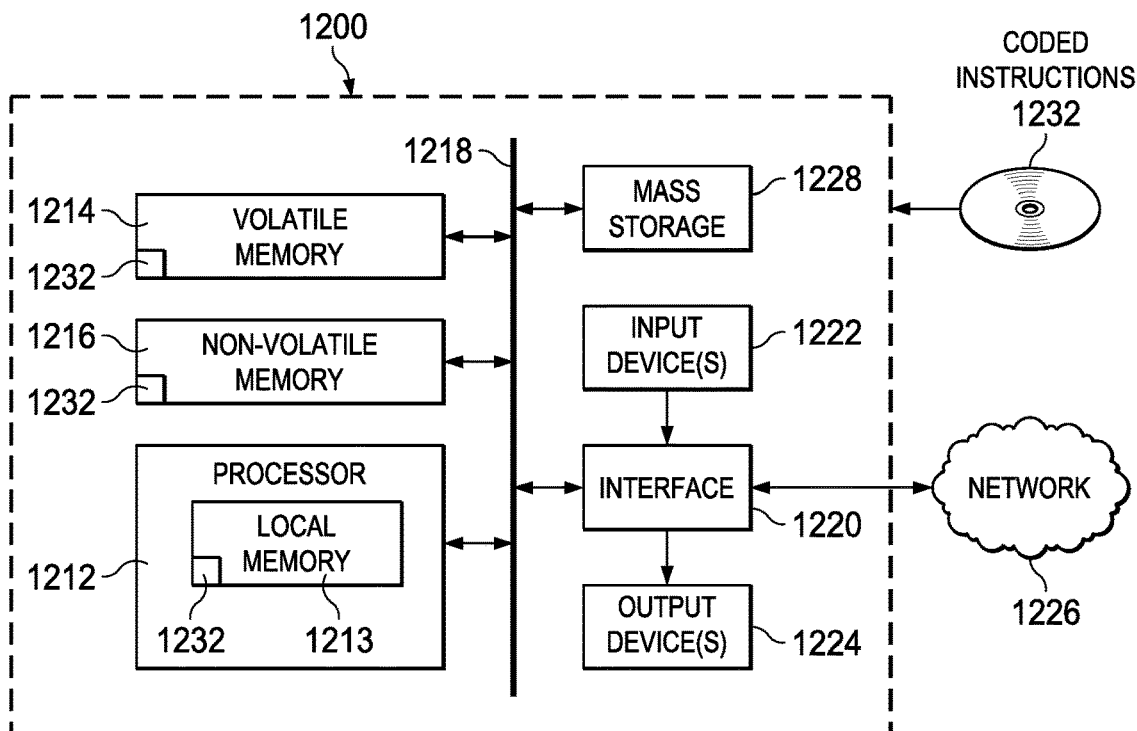
FIG. 12 is a block diagram of a processor platform structured to execute the example machine readable instructions of FIGS. 10-11 to implement the example high side level shifter of FIGS. 1-3, 5, and/or 7.

FIG. 12 is a block diagram of an example processor platform 1200 structured to execute the instructions of FIGS. 10-11 to implement the HS level shifter 105a, 105b and/or the controller 102 of FIGS. 1-3, 5, and/or 7. The processor platform 1200 can be, for example, a server, a self-learning machine (e.g., a neural network), an Internet appliance, a microcontroller, or any other type of computing device.

The processor platform 1200 of the illustrated example includes a processor 1212. The processor 1212 of the illustrated example is hardware. For example, the processor 1212 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the high side level shifting trigger 106a, 106b and/or the HS level shifter latch 108.

The processor 1212 of the illustrated example includes a local memory 1213 (e.g., a cache). The processor 1212 of the illustrated example is in communication with a main memory including a volatile memory 1214 and a non-volatile memory 1216 via a bus 1218. The volatile memory 1214 may be implemented by Synchronous Dynamic Random-Access Memory (SDRAM), Dynamic Random-Access Memory (DRAM), RAMBUS® Dynamic Random-Access Memory (RDRAM®) and/or any other type of random access memory device. The non-volatile memory 1216 may be implemented by flash memory and/or any other desired type of memory device. Access to the main memory 1214, 1216 is controlled by a memory controller.

The processor platform 1200 of the illustrated example also includes an interface circuit 1220. The interface circuit 1220 may be implemented by any type of interface standard, such as an Ethernet interface, a universal serial bus (USB), a Bluetooth® interface, a near field communication (NFC) interface, and/or a PCI express interface.

In the illustrated example, one or more input devices 1222 are connected to the interface circuit 1220. The input device(s) 1222 permit(s) a user to enter data and/or commands into the processor 1212. The input device(s) can be implemented by, for example, a sensor, a microphone, a camera (still or video), a keyboard, or a button.

One or more output devices 1224 are also connected to the interface circuit 1220 of the illustrated example. The output devices 1224 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, and/or speaker. The interface circuit 1220 of the illustrated example, thus, typically includes a graphics driver card, a graphics driver chip and/or a graphics driver processor.

The interface circuit 1220 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1226. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1200 of the illustrated example also includes one or more mass storage devices 1228 for storing software and/or data. Examples of such mass storage devices 1228 include floppy disk drives, hard drive disks, compact disk drives, Blu-ray disk drives, redundant array of independent disks (RAID) systems, and digital versatile disk (DVD) drives.

The machine executable instructions 1232 of FIGS. 10-11 may be stored in the mass storage device 1228, in the volatile memory 1214, in the non-volatile memory 1216, and/or on a removable non-transitory computer readable storage medium such as a CD or DVD.

Example 1 includes an apparatus comprising a latch including a first node coupled to a first source of a first switch and an output coupled to a first gate of the first switch, a first diode coupled to the first node and a second node, a second diode coupled to the second node and ground, a second switch coupled to a voltage source and the second node, and a third switch including a third gate coupled to the second switch, a third source coupled to the second node, and a third drain coupled to the latch.

Example 2 includes the apparatus of example 1, wherein the voltage source is coupled to ground.

Example 3 includes the apparatus of example 1, wherein the first switch is a high side switch coupled to an output stage of a power converter.

Example 4 includes the apparatus of example 3, further including a low side switch coupled to the output stage of the power converter, the low side switch including a first drain-to-source resistance lower than a second drain-to-source resistance of the high side switch.

Example 5 includes the apparatus of example 1, further including a fourth switch coupled to the voltage source, and a fifth switch including a fifth gate coupled to the fourth switch, a fifth source coupled to the second node, and a fifth drain coupled to the latch.

Example 6 includes the apparatus of example 5, wherein the second switch is coupled to the second node via a first resistor and the fifth switch is coupled to the second node via a second resistor.

Example 7 includes the apparatus of example 1, wherein the first diode includes a first anode and a first cathode, wherein the first anode is coupled to the second node and the first cathode is coupled to the first node.

Example 8 includes the apparatus of example 7, wherein the second diode includes a second anode and a second cathode, wherein the second anode is coupled to the second node and the second cathode is coupled to ground.

Example 9 includes the apparatus of example 1, further including a bond pad to couple second switch to the latch, the bond pad including a two-dimensional electron gas layer coupled to a contact, the contact coupled to the first node.

Example 10 includes the apparatus of example 9, wherein the two-dimensional electron gas layer and the contact coupled to the first node reduce parasitic capacitance.

Example 11 includes an apparatus comprising a latch to output a first voltage corresponding to a first node or a second voltage corresponding to a second node to a transistor of a power converter based on a first or second state of the latch, the second node being coupled to a source of the transistor, a first diode to create a first voltage drop from a third node to the second node when the second voltage corresponding to the second node is negative and to prevent first current from flowing from the second node to the third node when the second voltage corresponding to the second node is positive, and a second diode to create a second voltage drop from the third node to ground when a third voltage at the third node is positive and prevent second current from flowing from ground to the third node when the third voltage at the third node is negative.

Example 12 includes the apparatus of example 11 includes further including a first transistor to, based on a first control signal, allow third current to flow from a voltage source to the third node through a first resistor, and a second transistor to enable when the first transistor allows the third current to flow through the first resistor, the enabling of the second transistor to generate a first path from the first node of the latch to the third node, the latch to trigger the first state of the latch in response to the enabling of the second transistor.

Example 13 includes the apparatus of example 12, further including a third transistor to, based on a second control signal, allow fourth current to flow from the voltage source to the third node through a second resistor, and a fourth transistor to enable when the third transistor allows the fourth current to flow through the second resistor, the enabling of the fourth transistor to generate a second path from the first node of the latch to the third node, the latch to trigger the second state of the latch in response to the enabling of the fourth transistor.

Example 14 includes the apparatus of example 11, wherein the transistor is a high side transistor including a first drain-to-source resistance, further including a low side transistor including a second drain-to-source resistance lower than the first drain-to-source resistance.

Example 15 includes the apparatus of example 11, further including a hysteresis circuit to add resistance to a first side of the latch or a second side of the latch based on a previous state of the latch.

Example 16 includes the apparatus of example 15, wherein the hysteresis circuit is to add resistance to prevent errors of the latch caused by parasitic capacitance.

Example 17 includes the apparatus of example 11, wherein the third voltage at the third node corresponds to the second voltage at the second node when the second voltage is negative and the third voltage at the third node corresponds to a voltage differential between the third node and ground when the second voltage is positive.

Example 18 includes the apparatus of example 11, further including a bond pad to couple the first diode to the latch, the bond pad including a two-dimensional electron gas layer coupled to the second node to reduce parasitic capacitance.

Example 19 includes a method comprising outputting, at a latch, a first voltage corresponding to a first node or a second voltage corresponding to a second node to a high side transistor of a power converter based on a control signal, the second node being coupled to a source of the high side transistor, generating a first voltage drop from a third node to the second node when the second voltage corresponding to the second node is negative and preventing first current from flowing from the second node to the third node when the second voltage corresponding to the second node is positive, and generating a second voltage drop from the third node to ground when a third voltage at the third node is positive and preventing second current from flowing from ground to the third node when the third voltage at the third node is negative.

Example 20 includes the method of example 19, further including adding resistance to a first side of the latch or a second side of the latch based on a previous state of the latch to add resistance to prevent errors of the latch caused by parasitic capacitance.

Example 21 includes the method of example 19, wherein the third voltage at the third node corresponds to the second voltage at the second node when the second voltage is negative and the third voltage at the third node corresponds to a voltage differential between the third node and ground when the second voltage is positive. From the foregoing, it will be appreciated that example methods, apparatus and articles of manufacture have been disclosed that facilitate high side control of a switching power converter. The disclosed methods, apparatus and articles of manufacture improve the efficiency of using a power converter by facilitating a low side control to high side control transition, even when the switching node of a power converter is negative. The disclosed methods, apparatus and articles of manufacture are accordingly directed to one or more improvement(s) in the functioning of a power converter.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
    a latch having a latch input node, a boost node, a switch node, and a latch output node;
    a first diode having an anode coupled to an intermediate ground node, and a cathode coupled to the switch node;
    a second diode having an anode coupled to the intermediate ground node, and a cathode coupled to an analog ground terminal;
    a first switch coupled between the latch input node and the intermediate ground node;
    a second switch coupled between a voltage supply node and a control terminal of the first switch;
    a high side power switch having a first current terminal, a second current terminal coupled to the switch node, and a control terminal coupled to the latch output node; and
    a low side power switch having a first current terminal coupled to the switch node, a second current terminal coupled to a power ground terminal, and a control terminal decoupled from the latch output node.

2. The apparatus of claim 1, wherein the second switch having a first current terminal coupled to the voltage supply node, and a second current terminal coupled to the control terminal of the second switch.

3. The apparatus of claim 2, further comprising:
    a resistor having a first end coupled to the second current terminal of the second switch, and a second end coupled to the intermediate ground node.

4. The apparatus of claim 1, wherein the first switch is configured to enable a conductive path between the latch input node and the intermediate ground node.

5. The apparatus of claim 1, wherein the second switch is configured to enable a conductive path between the voltage supply node and the control terminal of the first switch.

6. The apparatus of claim 1, wherein the first diode includes a diode-connected gallium nitride transistor.

7. The apparatus of claim 1, wherein the second diode includes a diode-connected gallium nitride transistor.

8. The apparatus of claim 1, further comprising:
    a bootstrap capacitor having a first plate coupled to the boost node, and a second plate coupled to the switch node; and
    a third diode having an anode coupled to the voltage supply node, and a cathode coupled to the boost node.

9. The apparatus of claim 1, wherein:
    the high side power switch having the first current terminal configured to receive an input voltage, and the second current terminal configured to deliver an output voltage; and
    the switch node is isolated from the intermediate ground node by the first diode.

10. The apparatus of claim 1, wherein:
    the low side power switch having the first current terminal configured to deliver the output voltage; and
    the power ground terminal is isolated from the intermediate ground node and the analog ground terminal.

11. An apparatus comprising:
    a latch having a latch upper supply node, a latch lower supply node, a latch input node, and a latch output node;
    a first diode having an anode coupled to an intermediate ground node, and a cathode coupled to the latch lower supply node;
    a second diode having an anode coupled to the intermediate ground node, and a cathode coupled to an analog ground terminal;
    a first switch configured to establish a conductive path between the latch input node and the intermediate ground node;
    a second switch configured to enable the first switch based on a gate driver input signal;
    a high side power switch having a first current terminal, a second current terminal coupled to the switch node, and a control terminal coupled to the latch output node; and
    a low side power switch having a first current terminal coupled to the switch node, a second current terminal coupled to a power ground terminal, and a control terminal decoupled from the latch output node.

12. The apparatus of claim 11, further comprising:
    a resistor having a first end, and a second end coupled to the intermediate ground node,
    wherein the second switch having a control terminal configured to receive the gate driver input signal, a first current terminal coupled to a voltage supply node, and a second current terminal coupled to the control terminal of the second switch and the first end of the resistor.

13. The apparatus of claim 11, wherein:
the first diode includes a first diode-connected gallium nitride transistor; and
the second diode includes a second diode-connected gallium nitride transistor.

14. The apparatus of claim 11, further comprising:
a bootstrap capacitor having a first plate coupled to the latch upper supply node, and a second plate coupled to the latch lower supply node; and
a third diode having an anode coupled to a voltage supply node, and a cathode coupled to the latch upper supply node.

15. The apparatus of claim 11, wherein:
the high side power switch having the first current terminal configured to receive an input voltage, and the second current terminal configured to deliver an output voltage; and
the switch node is isolated from the intermediate ground node by the first diode.

16. The apparatus of claim 11, wherein:
the low side power switch having the first current terminal configured to deliver the output voltage; and
the power ground terminal is isolated from the intermediate ground node and the analog ground terminal.

17. An apparatus comprising:
a latch having a latch upper supply node, a latch lower supply node, a latch input node, and a latch output node;
a first diode-connected gallium nitride (GaN) transistor having a anode coupled to an intermediate ground node, and a cathode coupled to the latch lower supply node;
a second diode-connected GaN transistor having a anode coupled to the intermediate ground node, and a cathode coupled to an analog ground terminal;
a first switch configured to establish a conductive path between the latch input node and the intermediate ground node;
a second switch configured to enable the first switch based on a high-side gate driver input signal;
a high side GaN power switch having a first current terminal, a second current terminal coupled to the switch node, and a control terminal coupled to the latch output node; and
a low side GaN power switch having a first current terminal coupled to the switch node, a second current terminal coupled to a power ground terminal, and a control terminal decoupled from the latch output node.

18. The apparatus of claim 17, wherein the switch node is coupled to the latch lower supply node and isolated from the intermediate ground node by the first diode.

19. The apparatus of claim 17, wherein the power ground terminal is isolated from the intermediate ground node and the analog ground terminal.

20. The apparatus of claim 17, further comprising:
a bootstrap capacitor having a first plate coupled to the latch upper supply node, and a second plate coupled to the latch lower supply node; and
a third diode having an anode coupled to a voltage supply node, and a cathode coupled to the latch upper supply node.

* * * * *